(12) United States Patent
Hwang et al.

(10) Patent No.: US 11,398,528 B2
(45) Date of Patent: Jul. 26, 2022

(54) DISPLAY PANEL OF AN ORGANIC LIGHT EMITTING DIODE DISPLAY DEVICE HAVING A PENTILE PIXEL STRUCTURE

(71) Applicant: Samsung Display Co., LTD., Yongin-si (KR)

(72) Inventors: Young-In Hwang, Suwon-si (KR); Eung Taek Kim, Hwaseong-si (KR); Yong Ho Yang, Suwon-si (KR); Seong Min Wang, Seongnam-si (KR); Joo Hyeon Jo, Hwaseong-si (KR); Jung-Mi Choi, Seoul (KR); Seong Baik Chu, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

(21) Appl. No.: 16/920,366

(22) Filed: Jul. 2, 2020

(65) Prior Publication Data

US 2021/0134892 A1 May 6, 2021

(30) Foreign Application Priority Data

Oct. 30, 2019 (KR) .................. 10-2019-0136340

(51) Int. Cl.
*H01L 27/32* (2006.01)
*G09G 3/3266* (2016.01)
*G09G 3/3275* (2016.01)

(52) U.S. Cl.
CPC ....... *H01L 27/3216* (2013.01); *G09G 3/3266* (2013.01); *G09G 3/3275* (2013.01); *H01L 27/3276* (2013.01)

(58) Field of Classification Search
CPC .. G09G 3/3266; G09G 3/3275; G09G 3/3216; H01L 27/3276
See application file for complete search history.

(56) References Cited

U.S. PATENT DOCUMENTS 9,076,381 B2    7/2015   Naoaki
9,990,889 B2    6/2018   Song et al.
(Continued)

FOREIGN PATENT DOCUMENTS

KR    10-0570696    4/2006
KR    10-0732824    6/2007
(Continued)

*Primary Examiner* — Sardis F Azongha
(74) *Attorney, Agent, or Firm* — H.C. Park & Associates, PLC

(57) ABSTRACT

A display panel may include a first OLED disposed in a first sub-pixel region and emitting light of a first color, a second OLED disposed in a second sub-pixel region and emitting light of a second color, a third OLED disposed in a third sub-pixel region and emitting light of a third color, a fourth OLED disposed in a fourth sub-pixel region and emitting light of the second color, a first sub-pixel circuit disposed in the first sub-pixel region and driving the third OLED in the third sub-pixel region, a second sub-pixel circuit disposed in the second sub-pixel region and driving the first OLED in the first sub-pixel region, a third sub-pixel circuit disposed in the third sub-pixel region and driving the fourth OLED in the fourth sub-pixel region, and a fourth sub-pixel circuit disposed in the fourth sub-pixel region and driving the second OLED in the second sub-pixel region.

21 Claims, 14 Drawing Sheets

(56) References Cited

U.S. PATENT DOCUMENTS

| | | | |
|---|---|---|---|
| 2013/0050236 A1* | 2/2013 | Hsu | H04N 9/73 345/589 |
| 2019/0131324 A1* | 5/2019 | Jiang | H01L 27/1244 |
| 2019/0279563 A1 | 9/2019 | Hwang et al. | |
| 2020/0098313 A1* | 3/2020 | Bian | G09G 3/3225 |

FOREIGN PATENT DOCUMENTS

| | | |
|---|---|---|
| KR | 10-2016-0024316 | 3/2016 |
| KR | 10-2019-0107216 | 9/2019 |

\* cited by examiner

DISPLAY PANEL OF AN ORGANIC LIGHT EMITTING DIODE DISPLAY DEVICE HAVING A PENTILE PIXEL STRUCTURE

CROSS REFERENCE TO RELATED APPLICATION

This application claims priority from and the benefit of Korean Patent Application No. 10-2019-0136340, filed on Oct. 30, 2019, which is hereby incorporated by reference for all purposes as if fully set forth herein.

BACKGROUND

Field

Exemplary embodiments/implementations of the invention relate generally to display devices and, more specifically, to display panels of organic light emitting diode (OLED) display devices having pentile pixel structures.

Discussion of the Background

To display a full color image, each pixel of an organic light emitting diode (OLED) display device may include sub-pixels emitting light of different colors, for example, red, green and blue sub-pixels. In a conventional OLED display device, the red, green and blue sub-pixels may be arranged in a stripe (or linear) form such that sub-pixels of the same color are arranged in each column.

Recently, to increase a resolution of a display screen, an OLED display device having a pentile pixel structure where a blue sub-pixel and/or a red sub-pixel are shared by two adjacent pixels has been developed. As used herein "pentile" refers to pixel structure in an OLED display device in which each pixel has two sub-pixels including one green sub-pixel and one red or blue sub-pixel, such as the RGBG matrix sub-pixel design marketed by the assignee of this application under its PenTile® trademark. Accordingly, in a pentile pixel structure, the pixel size may be reduced, and thus resolution of the OLED display device may be increased.

However, in a conventional OLED display device having the pentile pixel structure, all of the red, green and blue sub-pixels are disposed in the same row, and thus the red, green and blue sub-pixels are driven under the same driving conditions (e.g., the same scan on time, the same off period ratio, etc.).

The above information disclosed in this Background section is only for understanding of the background of the inventive concepts, and, therefore, it may contain information that does not constitute prior art.

SUMMARY

Devices constructed according to exemplary embodiments of the invention are capable of providing a display panel of an organic light emitting diode (OLED) display device having a pentile pixel structure where an OLED of a second color (e.g., a green color) can be driven under a driving condition (e.g., a scan on time, an off period ratio, etc.) different from a driving condition for an OLED of another color.

Some exemplary embodiments provide an OLED display device having a pentile pixel structure where an OLED of a second color (e.g., a green color) can be driven under a driving condition (e.g., a scan on time, an off period ratio, etc.) different from a driving condition for an OLED of another color.

Additional features of the inventive concepts will be set forth in the description which follows, and in part will be apparent from the description, or may be learned by practice of the inventive concepts.

According to some exemplary embodiments, a display panel of an OLED display device includes a first OLED disposed in a first sub-pixel region located in a first row, and configured to emit light of a first color, a second OLED disposed in a second sub-pixel region located in the first row, and configured to emit light of a second color, a third OLED disposed in a third sub-pixel region located in a second row, and configured to emit light of a third color, a fourth OLED disposed in a fourth sub-pixel region located in the second row, and configured to emit light of the second color, a first sub-pixel circuit disposed in the first sub-pixel region, and configured to drive the third OLED in the third sub-pixel region, a second sub-pixel circuit disposed in the second sub-pixel region, and configured to drive the first OLED in the first sub-pixel region, a third sub-pixel circuit disposed in the third sub-pixel region, and configured to drive the fourth OLED in the fourth sub-pixel region, and a fourth sub-pixel circuit disposed in the fourth sub-pixel region, and configured to drive the second OLED in the second sub-pixel region.

In exemplary embodiments, the first OLED may be a red OLED configured to emit red light, the second and fourth OLEDs may be green OLEDs configured to emit green light, and the third OLED may be a blue OLED configured to emit blue light.

In exemplary embodiments, the display panel may further include a first line configured to connect the first sub-pixel circuit in the first sub-pixel region to the third OLED in the third sub-pixel region, a second line configured to connect the second sub-pixel circuit in the second sub-pixel region to the first OLED in the first sub-pixel region, a third line configured to connect the third sub-pixel circuit in the third sub-pixel region to the fourth OLED in the fourth sub-pixel region, and a fourth line configured to connect the fourth sub-pixel circuit in the fourth sub-pixel region to the second OLED in the second sub-pixel region.

In exemplary embodiments, the first and second sub-pixel circuits in the first and second sub-pixel regions may be configured to receive a same first scan signal through a first scan line, and the third and fourth sub-pixel circuits in the third and fourth sub-pixel regions may be configured to receive a same second scan signal through a second scan line.

In exemplary embodiments, a second scan on time (SOT) of the second scan signal applied to the third and fourth sub-pixel circuits may be different from a first SOT of the first scan signal applied to the first and second sub-pixel circuits.

In exemplary embodiments, a second SOT of the second scan signal applied to the third and fourth sub-pixel circuits may be longer than a first SOT of the first scan signal applied to the first and second sub-pixel circuits.

In exemplary embodiments, a second threshold voltage compensation time for driving transistors included in the third and fourth sub-pixel circuits may be longer than a first threshold voltage compensation time for driving transistors included in the first and second sub-pixel circuits.

In exemplary embodiments, the first and second sub-pixel circuits in the first and second sub-pixel regions may be configured to receive a same first emission control signal through a first emission control line, and the third and fourth sub-pixel circuits in the third and fourth sub-pixel regions may be configured to receive a same second emission control signal through a second emission control line.

In exemplary embodiments, a second off period ratio of the second emission control applied to the third and fourth sub-pixel circuits may be different from a first off period ratio of the first emission control signal applied to the first and second sub-pixel circuits.

In exemplary embodiments, a second off period ratio of the second emission control applied to the third and fourth sub-pixel circuits may be greater than a first off period ratio of the first emission control signal applied to the first and second sub-pixel circuits.

In exemplary embodiments, the third and fourth sub-pixel circuits may drive the second and fourth OLEDs to emit the light of the second color with the second off period ratio that is increased compared with the first off period ratio for the first and third OLEDs.

In exemplary embodiments, the third and fourth sub-pixel circuits may provide the second and fourth OLEDs with a driving current corresponding to the increased second off period ratio, the driving current being provided to the second and fourth OLEDs being greater than a driving current provided to the first and third OLEDs.

In exemplary embodiments, the first and second sub-pixel circuits may be configured to receive the first emission control signal from a first emission driver located at a first side of the display panel, and the third and fourth sub-pixel circuits may be configured to receive the second emission control signal from a second emission driver located at a second side opposite to the first side of the display panel.

According to some exemplary embodiments, there is provided a display panel of an OLED display device including a first OLED disposed in a first sub-pixel region located in a first row, and configured to emit light of a first color, a second OLED disposed in a second sub-pixel region located in the first row, and configured to emit light of a second color, a third OLED disposed in a third sub-pixel region located in a second row, and configured to emit light of a third color, a fourth OLED disposed in a fourth sub-pixel region located in the second row, and configured to emit light of the second color, a first sub-pixel circuit disposed in the first sub-pixel region, and configured to drive the second OLED in the second sub-pixel region, a second sub-pixel circuit disposed in the second sub-pixel region, and configured to drive the fourth OLED in the fourth sub-pixel region, a third sub-pixel circuit disposed in the third sub-pixel region, and configured to drive the first OLED in the first sub-pixel region, and a fourth sub-pixel circuit disposed in the fourth sub-pixel region, and configured to drive the third OLED in the third sub-pixel region.

In exemplary embodiments, the first OLED may be a red OLED configured to emit red light, the second and fourth OLEDs may be green OLEDs configured to emit green light, and the third OLED may be a blue OLED configured to emit blue light.

In exemplary embodiments, the display panel may further include a first line configured to connect the first sub-pixel circuit in the first sub-pixel region to the second OLED in the second sub-pixel region, a second line configured to connect the second sub-pixel circuit in the second sub-pixel region to the fourth OLED in the fourth sub-pixel region, a third line configured to connect the third sub-pixel circuit in the third sub-pixel region to the first OLED in the first sub-pixel region, and a fourth line configured to connect the fourth sub-pixel circuit in the fourth sub-pixel region to the third OLED in the third sub-pixel region.

In exemplary embodiments, the first and second sub-pixel circuits in the first and second sub-pixel regions may be configured to receive a same first scan signal through a first scan line, the third and fourth sub-pixel circuits in the third and fourth sub-pixel regions may be configured to receive a same second scan signal through a second scan line, and a first SOT of the first scan signal applied to the first and second sub-pixel circuits may be longer than a second SOT of the second scan signal applied to the third and fourth sub-pixel circuits.

In exemplary embodiments, the first and second sub-pixel circuits in the first and second sub-pixel regions may be configured to receive a same first emission control signal through a first emission control line, the third and fourth sub-pixel circuits in the third and fourth sub-pixel regions may be configured to receive a same second emission control signal through a second emission control line, and a first off period ratio of the first emission control signal applied to the first and second sub-pixel circuits may be greater than a second off period ratio of the second emission control applied to the third and fourth sub-pixel circuits.

In exemplary embodiments, the first and second sub-pixel circuits may drive the second and fourth OLEDs to emit the light of the second color with the first off period ratio that is increased compared with the second off period ratio for the first and third OLEDs, and the first and second sub-pixel circuits may provide the second and fourth OLEDs with a driving current corresponding to the increased first off period ratio, the driving current being provided to the second and fourth OLEDs being greater than a driving current provided to the first and third OLEDs.

According to some exemplary embodiments, an OLED display device includes a display panel, a data driver configured to provide data signals to the display panel, a scan driver configured to provide scan signals to the display panel, an emission driver configured to provide emission control signals to the display panel, and a controller configured to control the data driver, the scan driver and the emission driver. The display panel includes a first OLED disposed in a first sub-pixel region located in a first row, and configured to emit light of a first color, a second OLED disposed in a second sub-pixel region located in the first row, and configured to emit light of a second color, a third OLED disposed in a third sub-pixel region located in a second row, and configured to emit light of a third color, a fourth OLED disposed in a fourth sub-pixel region located in the second row, and configured to emit light of the second color, a first sub-pixel circuit disposed in the first sub-pixel region, and configured to drive the third OLED in the third sub-pixel region, a second sub-pixel circuit disposed in the second sub-pixel region, and configured to drive the first OLED in the first sub-pixel region, a third sub-pixel circuit disposed in the third sub-pixel region, and configured to drive the fourth OLED in the fourth sub-pixel region, and a fourth sub-pixel circuit disposed in the fourth sub-pixel region, and configured to drive the second OLED in the second sub-pixel region, wherein the first and second sub-pixel circuits in the first and second sub-pixel regions are configured to receive a same first scan signal through a first scan line, and wherein the third and fourth sub-pixel circuits in the third and fourth sub-pixel regions are configured to receive a same second scan signal through a second scan line.

In exemplary embodiments, the scan driver may provide the first scan signal and the second scan signal, wherein a second scan on time (SOT) of the second scan signal applied to the third and fourth sub-pixel circuits may be different from a first SOT of the first scan signal applied to the first and second sub-pixel circuits.

In exemplary embodiments, a second SOT of the second scan signal applied to the third and fourth sub-pixel circuits may be longer than a first SOT of the first scan signal applied to the first and second sub-pixel circuits.

In exemplary embodiments, a second threshold voltage compensation time for driving transistors included in the third and fourth sub-pixel circuits may be longer than a first threshold voltage compensation time for driving transistors included in the first and second sub-pixel circuits.

In exemplary embodiments, the emission driver may provide a first emission control signal and a second emission control signal, and the first and second sub-pixel circuits in the first and second sub-pixel regions may receive the first emission control signal through a first emission control line, and the third and fourth sub-pixel circuits in the third and fourth sub-pixel regions may receive the second emission control signal through a second emission control line.

In exemplary embodiments, a second off period ratio of the second emission control signal applied to the third and fourth sub-pixel circuits may be different from a first off period ratio of the first emission control signal applied to the first and second sub-pixel circuits.

In exemplary embodiments, a second off period ratio of the second emission control signal applied to the third and fourth sub-pixel circuits may be greater than a first off period ratio of the first emission control signal applied to the first and second sub-pixel circuits.

In exemplary embodiments, the third and fourth sub-pixel circuits may drive the second and fourth OLEDs to emit the light of the second color with the second off period ratio that is increased compared with the first off period ratio for the first and third OLEDs.

In exemplary embodiments, the third and fourth sub-pixel circuits may provide the second and fourth OLEDs with a driving current corresponding to the increased second off period ratio, the driving current being provided to the second and fourth OLEDs being greater than a driving current provided to the first and third OLEDs.

As described above, in a display panel and an OLED display device according to exemplary embodiments, OLEDs may be arranged in an RGBG pentile structure, and four sub-pixel circuits in two rows and two columns may drive four OLEDs that are adjacent to the sub-pixel circuits in a counterclockwise direction or a clockwise direction. Thus, the sub-pixel circuits for driving the OLEDs of a second color (e.g., a green color) and the sub-pixel circuits for driving the OLEDs of first and third colors (e.g., a red color and a blue color) may be disposed in different rows. Accordingly, the OLED of the second color can be driven under a driving condition (e.g., a scan on time, an off period ratio (e.g., an AMOLED off ratio (AOR)), etc.) different from a driving condition for the OLEDs of the first and third colors, and thus a mura and/or an afterimage may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
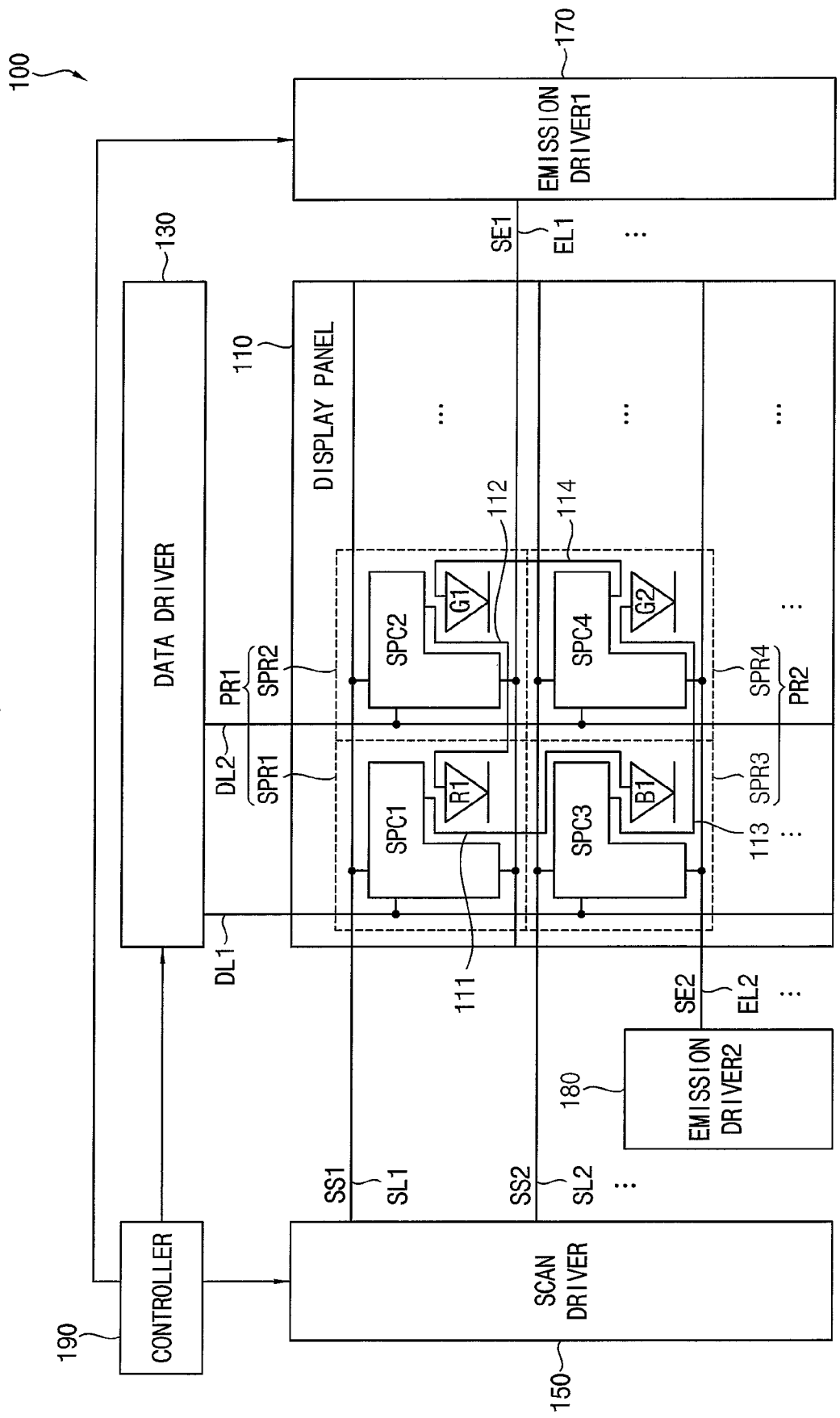
FIG. 1 is a block diagram illustrating an organic light emitting diode (OLED) display device according to exemplary embodiments.

In the following description, for the purposes of explanation, numerous specific details are set forth in order to provide a thorough understanding of various exemplary embodiments or implementations of the invention. As used herein "exemplary embodiments or implementations" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The exemplary embodiments are described more fully hereinafter with reference to the accompanying drawings. Like or similar reference numerals refer to like or similar elements throughout.

FIG. 1 is a block diagram illustrating an organic light emitting diode (OLED) display device according to exemplary embodiments.

Referring to FIG. 1, an OLED display device 100 may include a display panel 110, a data driver 130 which provides data signals to the display panel 110, a scan driver 150 which provides scan signals SS1 and SS2 to the display panel 110, an emission driver 170 and 180 which provides emission control signals SE1 and SE2 to the display panel 110, and a controller (e.g., a timing controller (TCON)) 190 which controls the data driver 130, the scan driver 150 and the emission driver 170 and 180.

The display panel 110 may have a plurality of pixel regions PR1 and PR2, and each pixel region PR1 and PR2 may include two sub-pixel regions SPR1 and SPR2, and SPR3 and SPR4, respectively. Further, in each sub-pixel region SPR1, SPR2, SPR3 and SPR4, one OLED R1, G1, B1 and G2 and one sub-pixel circuit SPC1, SPC2, SPC3 and SPC4 may be disposed.

In the display panel 110, the OLEDs R1, G1, B1 and G2 may be arranged in a pentile structure such that, in each pixel region PR1 and PR2, one OLED G1 and G2 of a second color (e.g., a green color) is disposed, and one OLED R1 of a first color (e.g., a red color) or one OLED B1 of a third color (e.g., a blue color) is alternately disposed. For example, as illustrated in FIG. 1, a first pixel region PR1 may include a first sub-pixel region SPR1 and a second sub-pixel region SPR2 that is adjacent to the first sub-pixel region SPR1 in a row direction (e.g., a direction of a scan line SL1 and SL2 or a direction of an emission control line EL1 and EL2). A first OLED R1 emitting red light may be disposed in the first sub-pixel region SPR1, and a second OLED G1 emitting green light may be disposed in the second sub-pixel region SPR2. Further, a second pixel region PR2 that is adjacent to the first pixel region PR1 in a column direction (e.g., a direction of a data line DL1 and DL2) may include a third sub-pixel region SPR3 that is adjacent to the first sub-pixel region SPR1 in the column direction, and a fourth sub-pixel region SPR4 that is adjacent to the second sub-pixel region SPR2 in the column direction and is adjacent to the third sub-pixel region SPR3 in the row direction. A third OLED B1 emitting blue light may be disposed in the third sub-pixel region SPR3, and a fourth OLED G2 emitting the green light may be disposed in the fourth sub-pixel region SPR4.

Figure 2:
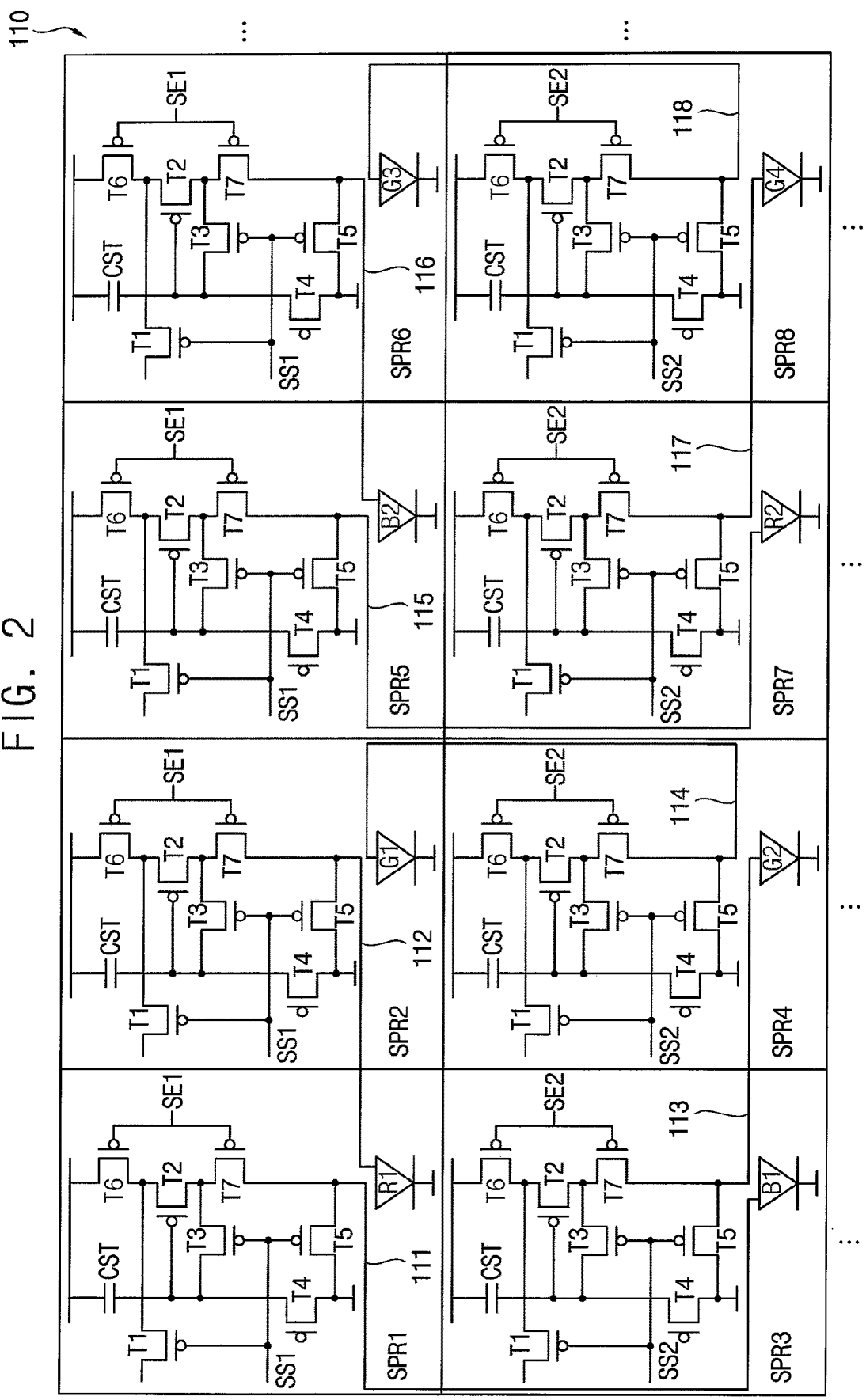
FIG. 2 is a circuit diagram illustrating an example of a display panel according to exemplary embodiments.
Figure 3:
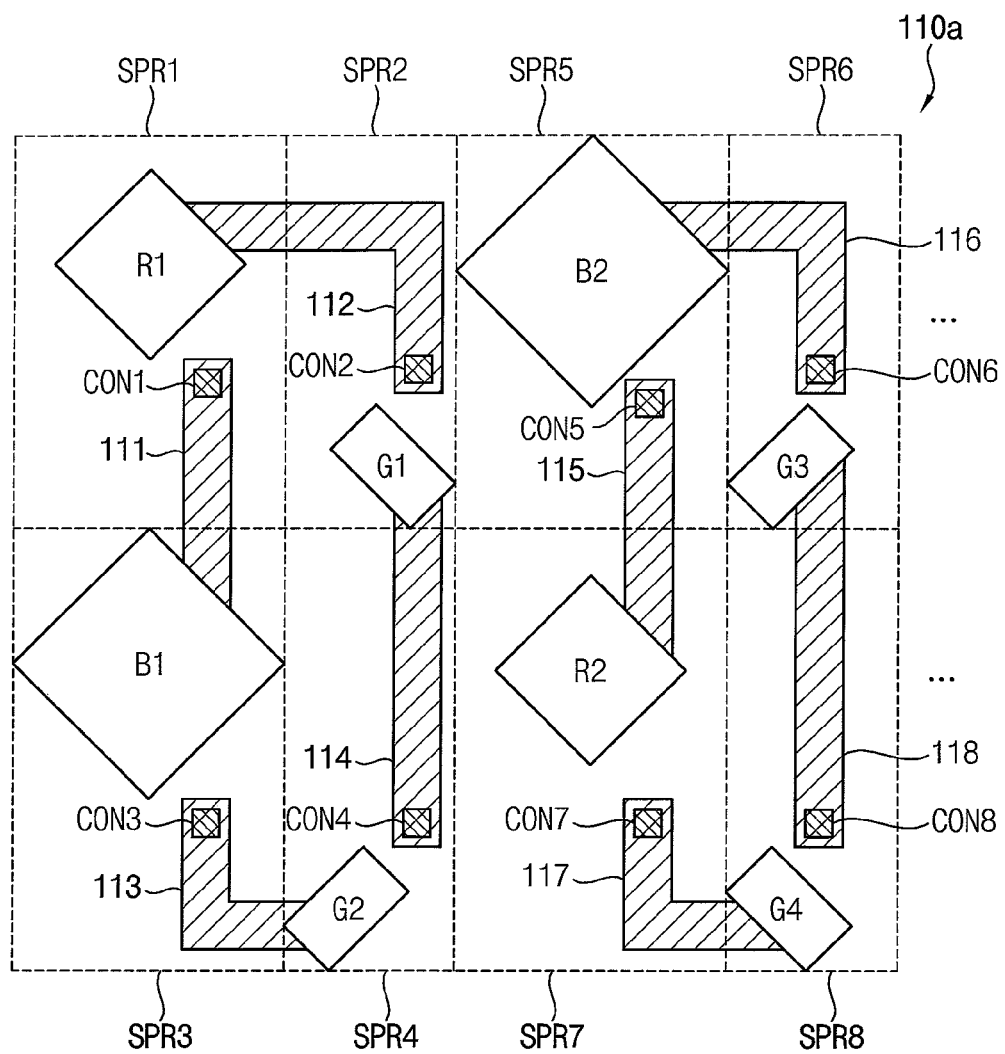
FIG. 3 is a diagram illustrating an example of a layout of OLEDs included in a display panel according to exemplary embodiments.

As described above, since two sub-pixels including one green OLED G1 and G2 and one red or blue OLED R1 and B1 are disposed in each pixel region PR1 and PR2, the display panel 110 may have a high resolution compared with a conventional display panel where each pixel includes three or more sub-pixels (e.g., red, green and blue sub-pixels). In some exemplary embodiments, as illustrated in FIGS. 1 through 3, red, green, blue and green OLEDs may be sequentially and repeatedly arranged (i.e., in an RGBG arrangement) in odd-numbered rows, and blue, green, red and green OLEDs may be sequentially and repeatedly arranged (i.e., in a BGRG arrangement) in even-numbered rows. However, the arrangements of the OLEDs are not limited to the RGBG and BGRG arrangements.

In four sub-pixel regions SPR1, SPR2, SPR3 and SPR4 in two adjacent rows and two adjacent columns, respective sub-pixel circuits SCP1, SCP2, SCP3 and SCP4 may be connected to the OLEDs B1, R1, G2 and G1 that are adjacent to the sub-pixel circuits SCP1, SCP2, SCP3 and SCP4 in a counterclockwise direction. For example, as illustrated in FIG. 1, the display panel 110 may include a first line 111 that connects a first sub-pixel circuit SPC1 disposed in the first sub-pixel region SPR1 to the third OLED B1 in the third sub-pixel region SPR3, a second line 112 that connects the second sub-pixel circuit SPC2 disposed in the second sub-pixel region SPR2 to the first OLED R1 in the first sub-pixel region SPR1, a third line 113 that connects the third sub-pixel circuit SPC3 disposed in the third sub-pixel region SPR3 to the fourth OLED G2 in the fourth sub-pixel region SPR4, and a fourth line 114 that connects the fourth sub-pixel circuit SPC4 disposed in the fourth sub-pixel region SPR4 to the second OLED G1 in the second sub-pixel region SPR2.

Further, in the four sub-pixel regions SPR1, SPR2, SPR3 and SPR4 in two adjacent rows and two adjacent columns, the respective sub-pixel circuits SCP1, SCP2, SCP3 and SCP4 may drive the OLEDs B1, R1, G2 and G1 that are adjacent to the sub-pixel circuits SCP1, SCP2, SCP3 and SCP4 in the counterclockwise direction. For example, as illustrated in FIG. 1, the first sub-pixel circuit SPC1 disposed in the first sub-pixel region SPR1 may drive the third OLED B1 in the third sub-pixel region SPR3, the second sub-pixel circuit SPC2 disposed in the second sub-pixel region SPR2 may drive the first OLED R1 in the first sub-pixel region SPR1, the third sub-pixel circuit SPC3 disposed in the third sub-pixel region SPR3 may drive the fourth OLED G2 in the fourth sub-pixel region SPR4, and the fourth sub-pixel circuit SPC4 disposed in the fourth sub-pixel region SPR4 may drive the second OLED G1 in the second sub-pixel region SPR2.

Accordingly, in some exemplary embodiments, the sub-pixel circuits SPC1 and SPC2 in a first row (e.g., an odd-numbered row), or the sub-pixel circuits SPC1 and SPC2 connected to a first scan line (e.g., an odd-numbered scan line) SL1 and/or a first emission control line (e.g., an odd-numbered emission control line) EL1 may drive only the OLEDs R1 and B1 emitting the light of the first color (e.g., the red color) or the third color (e.g., the blue color), and the sub-pixel circuits SPC3 and SPC4 in a second row (e.g., an even-numbered row), or the sub-pixel circuits SPC3 and SPC4 connected to a second scan line (e.g., an even-numbered scan line) SL2 and/or a second emission control line (e.g., an even-numbered emission control line) EL2 may drive only the OLEDs G1 and G2 emitting the light of the second color (e.g., the green color). Thus, since the sub-pixel circuits SPC3 and SPC4 for driving the OLEDs G1 and G2 emitting the light of the second color (e.g., the green color) are connected to the scan and emission control lines SL2 and EL2 separate from the scan and emission control lines SL1 and EL1 connected to the sub-pixel circuits SPC1 and SPC2 for driving the OLEDs R1 and B1 emitting the light of the first color (e.g., the red color) or the third color (e.g., the blue color), the OLEDs G1 and G2 emitting the light of the second color may be driven under a driving condition (e.g., a scan on time, an off period ratio (which may be referred to as an AMOLED off ratio (AOR)), etc.) different from a driving condition for the OLEDs R1 and B1 emitting the light of the first color or the third color.

In some exemplary embodiments, the scan driver 150 may apply a first scan signal SS1 having a first scan on time (SOT) to the first scan line (e.g., the odd-numbered scan line) SL1 connected to the sub-pixel circuits SPC1 and SPC2 for driving the OLEDs R1 and B1 emitting the light of the first color or the third color, and may apply a second scan signal SS2 having a second SOT different (in length) from the first SOT to the second scan line (e.g., the even-numbered scan line) SL2 connected to the sub-pixel circuits SPC3 and SPC4 for driving the OLEDs G1 and G2 emitting the light of the second color. For example, the second SOT of the second scan signal SS2 applied to the sub-pixel circuits SPC3 and SPC4 for driving the OLEDs G1 and G2 emitting the light of the second color may be longer than the first SOT of the first scan signal SS1 applied to the sub-pixel circuits SPC1 and SPC2 for driving the OLEDs R1 and B1 emitting the light of the first color or the third color. In some exemplary embodiments, during the SOT, each sub-pixel circuit SPC1, SPC2, SPC3 and SPC4 may not only store the data signal, but also compensate a threshold voltage of a driving transistor, and thus the SOT of the scan signal SS1 and SS2 applied to each sub-pixel circuit SPC1, SPC2, SPC3 and SPC4 may be substantially the same as a threshold voltage compensation time for the driving transistor included in each sub-pixel circuit SPC1, SPC2, SPC3 and SPC4. Accordingly, a second threshold voltage compensation time for driving transistors included in the sub-pixel circuits SPC3 and SPC4 for driving the OLEDs G1 and G2 emitting the light of the second color may be longer than a first threshold voltage compensation time for driving transistors included in the sub-pixel circuits SPC1 and SPC2 for driving the OLEDs R1 and B1 emitting the light of the first color or the third color.

Generally, compared with the driving transistor of the sub-pixel circuit SPC1 and SPC2 for driving the red or green OLED R1 and B1, the driving transistor of the sub-pixel circuit SPC3 and SPC4 for driving the green OLED G1 and G2 may have a relatively high compensation point, and thus may require a relatively long threshold voltage compensation time. As described above, in the OLED display device 100 according to exemplary embodiments, the second threshold voltage compensation time for the driving transistor included in the sub-pixel circuit SPC3 and SPC4 for driving the green OLED G1 and G2 may be longer than the first threshold voltage compensation time for the driving transistor included in the sub-pixel circuit SPC1 and SPC2 for driving the red or blue OLED R1 and B1, and thus the sub-pixel circuit SPC3 and SPC4 for driving the green OLED G1 and G2 that is vulnerable to a mura may perform a threshold voltage compensation operation for a sufficient threshold voltage compensation time. Accordingly, the mura of the OLED display device 100 may be reduced or prevented.

Further, in some exemplary embodiments, the emission driver 170 and 180 may apply a first emission control signal SE1 with a first off period ratio to the first emission control line (e.g., the odd-numbered emission control line) EL1 connected to the sub-pixel circuits SPC1 and SPC2 for driving the OLEDs R1 and B1 emitting the light of the first color or the third color, and may apply a second emission control signal SE2 with a second off period ratio different from the first off period ratio to the second emission control line (e.g., the even-numbered emission control line) EL2 connected to the sub-pixel circuits SPC3 and SPC4 for driving the OLEDs G1 and G2 emitting the light of the second color.

In some exemplary embodiments, as illustrated in FIG. 1, the OLED display device 100 may include a first emission driver 170 located at a first side (e.g., a right side) of the display panel 110, and a second emission driver 180 located at a second side (e.g., a left side) opposite to the first side of the display panel 110. The first emission driver 170 may apply the first emission control signals SE1 with the first off period ratio to the odd-numbered emission control lines EL1 such that the first emission control signals SE1 having the first off period ratio may be provided to the sub-pixel circuits SPC1 and SPC2 for driving the OLEDs R1 and B1 emitting the light of the first color or the third color, and the second emission driver 180 may apply the second emission control signals SE2 with the second off period ratio to the even-numbered emission control lines EL2 such that the second emission control signals SE2 having the second off period ratio may be provided to the sub-pixel circuits SPC3 and SPC4 for driving the OLEDs G1 and G2 emitting the light of the second color.

In some exemplary embodiments, the second off period ratio of the second emission control signal SE2 applied to the sub-pixel circuits SPC3 and SPC4 for driving the OLEDs G1 and G2 emitting the light of the second color may be greater than the first off period ratio of the first emission control signal SE1 applied to the sub-pixel circuits SPC1 and SPC2 for driving the OLEDs R1 and B1 emitting the light of the first color or the third color. Thus, the sub-pixel circuits SPC3 and SPC4 receiving the second emission control signal SE2 may drive the OLEDs G1 and G2 to emit the light of the second color with the second off period ratio that is increased compared with the first off period ratio for the OLEDs R1 and B1 emitting the light of the first color or the third color. Further, the sub-pixel circuits SPC3 and SPC4 receiving the second emission control signal SE2 may provide the OLEDs G1 and G2 emitting the light of the second color with a driving current that is increased corresponding to the increased second off period ratio. Accordingly, the OLED display device 100 according to exemplary embodiments may allow the driving transistors of the sub-pixel circuits SPC3 and SPC4 to generate the increased driving currents, or higher driving currents, thereby reducing an afterimage caused by a hysteresis of the driving transistors.

As described above, in the OLED display device 100 according to exemplary embodiments, the OLEDs R1, G1, B1 and G2 may be arranged in an RGBG pentile structure, and the four sub-pixel circuits SPC1, SPC2, SPC3 and SPC4 in two rows and two columns may drive the four OLEDs B1, R1, G2 and B1 that are adjacent to the sub-pixel circuits SPC1, SPC2, SPC3 and SPC4 in the counterclockwise direction. Thus, the sub-pixel circuits SPC3 and SPC4 for driving the OLEDs G1 and G2 of the second color (e.g., the green color) and the sub-pixel circuits SPC1 and SPC2 for driving the OLEDs R1 and B1 of the first and third colors (e.g., the red and blue colors) may be disposed in different rows. Accordingly, the OLEDs G1 and G2 of the second color can be driven under a driving condition (e.g., the SOT, the AOR, etc.) different from a driving condition for the OLEDs R1 and B1 of the first and third colors, and thus the mura and/or the afterimage may be reduced.

FIG. 2 is a circuit diagram illustrating an example of a display panel according to exemplary embodiments, and FIG. 3 is a diagram illustrating an example of a layout of OLEDs included in a display panel according to exemplary embodiments.

Referring to FIG. 2, a display panel 110 may include a plurality of sub-pixel regions SPR1, SPR2, SPR3, SPR4, SPR5, SPR6, SPR7 and SPR8, and, in each sub-pixel region SPR1, SPR2, SPR3, SPR4, SPR5, SPR6, SPR7 and SPR8, one of the OLEDs R1, G1, B1, G2, B2, G3, R2 and G4 and one sub-pixel circuit may be disposed. In some exemplary embodiments, as illustrated in FIG. 2, red, green, blue and green OLEDs R1, G1, B2 and G3 may be sequentially and repeatedly arranged in an odd-numbered row, and blue, green, red and green OLEDs B1, G2, R2 and G4 may be sequentially and repeatedly arranged in an even-numbered row. However, the arrangements of the OLEDs are not limited to an example of FIG. 2.

In some exemplary embodiments, as illustrated in FIG. 2, each sub-pixel circuit may have a 7T1C structure including seven transistors T1, T2, T3, T4, T5, T6 and T7 and one capacitor CST. For example, each sub-pixel circuit may include a first transistor T1 which transfers a data signal to one terminal of a second transistor T2 in response to a scan signal SS1 and SS2, a storage capacitor CST which stores the data signal transferred through the diode-connected second transistor T2, the second transistor T2 which generates a driving current based on the data signal stored in the storage capacitor CST, a third transistor T3 which diode-connects the second transistor T2 in response to the scan signal SS1 and SS2, a fourth transistor T4 which applies an initialization voltage to the storage capacitor CST and a gate of the second transistor T2 in response to an initialization signal, a fifth transistor T5 which applies the initialization voltage to the OLED R1, G1, B1, G2, B2, G3, R2 and G4 in response to the scan signal SS1 and SS2, a sixth transistor T6 which connects a line of a power supply voltage to the second transistor T2 in response to an emission control signal SE1 and SE2, and a seventh transistor T7 which connects the second transistor T2 to the OLED R1, G1, B1, G2, B2, G3, R2 and G4 in response to the emission control signal SE1 and SE2. However, the configuration of the sub-pixel circuit is not limited to the example of FIG. 2.

In four sub-pixel regions (e.g., SPR1, SPR2, SPR3 and SPR4) in two adjacent rows and two adjacent columns, respective sub-pixel circuits may drive the OLEDs (e.g., B1, R1, G2 and G1) that are adjacent to the sub-pixel circuits in a counterclockwise direction. Thus, in the example of FIG. 2, a first sub-pixel circuit disposed in a first sub-pixel region SPR1 in a first row and a first column may drive a third OLED B1 disposed in a third sub-pixel region SPR3, a third sub-pixel circuit disposed in the third sub-pixel region SPR3 in a second row and the first column may drive a fourth OLED G2 disposed in a fourth sub-pixel region SPR4, a fourth sub-pixel circuit disposed in the fourth sub-pixel region SPR4 in the second row and a second column may drive a second OLED G1 disposed in a second sub-pixel region SPR2, and a second sub-pixel circuit disposed in the second sub-pixel region SPR2 in the first row and the second column may drive a first OLED R1 disposed in the first sub-pixel region SPR1. Further, a fifth sub-pixel circuit disposed in a fifth sub-pixel region SPR5 in the first row and a third column may drive a seventh OLED R2 disposed in a seventh sub-pixel region SPR7, a seventh sub-pixel circuit disposed in the seventh sub-pixel region SPR7 in the second row and the third column may drive an eighth OLED G4 disposed in an eighth sub-pixel region SPR8, an eighth sub-pixel circuit disposed in the eighth sub-pixel region SPR8 in the second row and a fourth column may drive a sixth OLED G3 disposed in a sixth sub-pixel region SPR6, and a sixth sub-pixel circuit disposed in the sixth sub-pixel region SPR6 in the first row and the fourth column may drive a fifth OLED B2 disposed in the fifth sub-pixel region SPR5.

To connect the sub-pixel circuits to the OLEDs R1, G1, B1, G2, B2, G3, R2 and G4 in the counterclockwise direction, as illustrated in FIG. 3, the display panel 110 and 110a may include lines 111, 112, 113, 114, 115, 116, 117 and 118 for connecting contact portions (e.g., VIA) CON1, CON2, CON3, CON4, CON5, CON6, CONT and CON8 contacting (drains of the seventh transistors T7 of) the sub-pixel circuits to the OLEDs R1, G1, B1, G2, B2, G3, R2 and G4 that are adjacent to the sub-pixel circuits in the counterclockwise direction. For example, the display panel 110 and 110a may include a first line 111 that connects a first contact portion CON1 contacting the first sub-pixel circuit to the third OLED B1, a third line 113 that connects a third contact portion CON3 contacting the third sub-pixel circuit to the fourth OLED G2, a fourth line 114 that connects a fourth contact portion CON4 contacting the fourth sub-pixel circuit to the second OLED G1, and a second line 112 that connects a second contact portion CON2 contacting the second sub-pixel circuit to the first OLED R1. Further, the display panel 110 and 110a may further include a fifth line 115 that connects a fifth contact portion CON5 contacting the fifth sub-pixel circuit to the seventh OLED R2, a seventh line 117 that connects a seventh contact portion CONT contacting the seventh sub-pixel circuit to the eighth OLED G4, an eighth line 118 that connects an eighth contact portion CON8 contacting the eighth sub-pixel circuit to the sixth OLED G3, and a sixth line 116 that connects a sixth contact portion CON6 contacting the sixth sub-pixel circuit to the fifth OLED B2. In some exemplary embodiments, the lines 111, 112, 113, 114, 115, 116, 117 and 118 may be formed by the same process for forming other lines included in the display panel 110 and 110a. Accordingly, a separate process for forming only the lines 111, 112, 113, 114, 115, 116, 117 and 118 may not be required.

In some exemplary embodiments, as illustrated in FIG. 3, adjacent four OLEDs (e.g., G1, B1, G2 and G2) may be arranged in a diamond shape, but the arrangement of the OLEDs according to exemplary embodiments may not be limited to the diamond shape. Further, in some exemplary embodiments, as illustrated in FIG. 3, each red OLED R1 and R2 may have a size smaller than a size of each blue OLED B1 and B2, and each green OLED G1, G2, G3 and G4 may have a size smaller than the size of each red OLED R1 and R2.

Further, as illustrated in FIG. 2, the sub-pixel circuits for driving the red and blue OLEDs R1, B1, B2 and R2 may receive a first scan signal SS1 and a first emission control signal SE1, and the sub-pixel circuits for driving the green OLEDs G1, G2, G3 and G4 may receive a second scan signal SS2 different from the first scan signal SS1 and a second emission control signal SE2 different from the first emission control signal SE1. Since the sub-pixel circuits for driving the green OLEDs G1, G2, G3 and G4 receive the second scan signal SS2 and the second emission control signal SE2 different from the first scan signal SS1 and the first emission control signal SE1 applied to the sub-pixel circuits for driving the red and blue OLEDs R1, B1, B2 and R2, the green OLEDs G1, G2, G3 and G4 and the red and blue OLEDs R1, B1, B2 and R2 may be driven under different driving conditions (e.g., different SOTs, different off period ratios, etc.).

Figure 4:
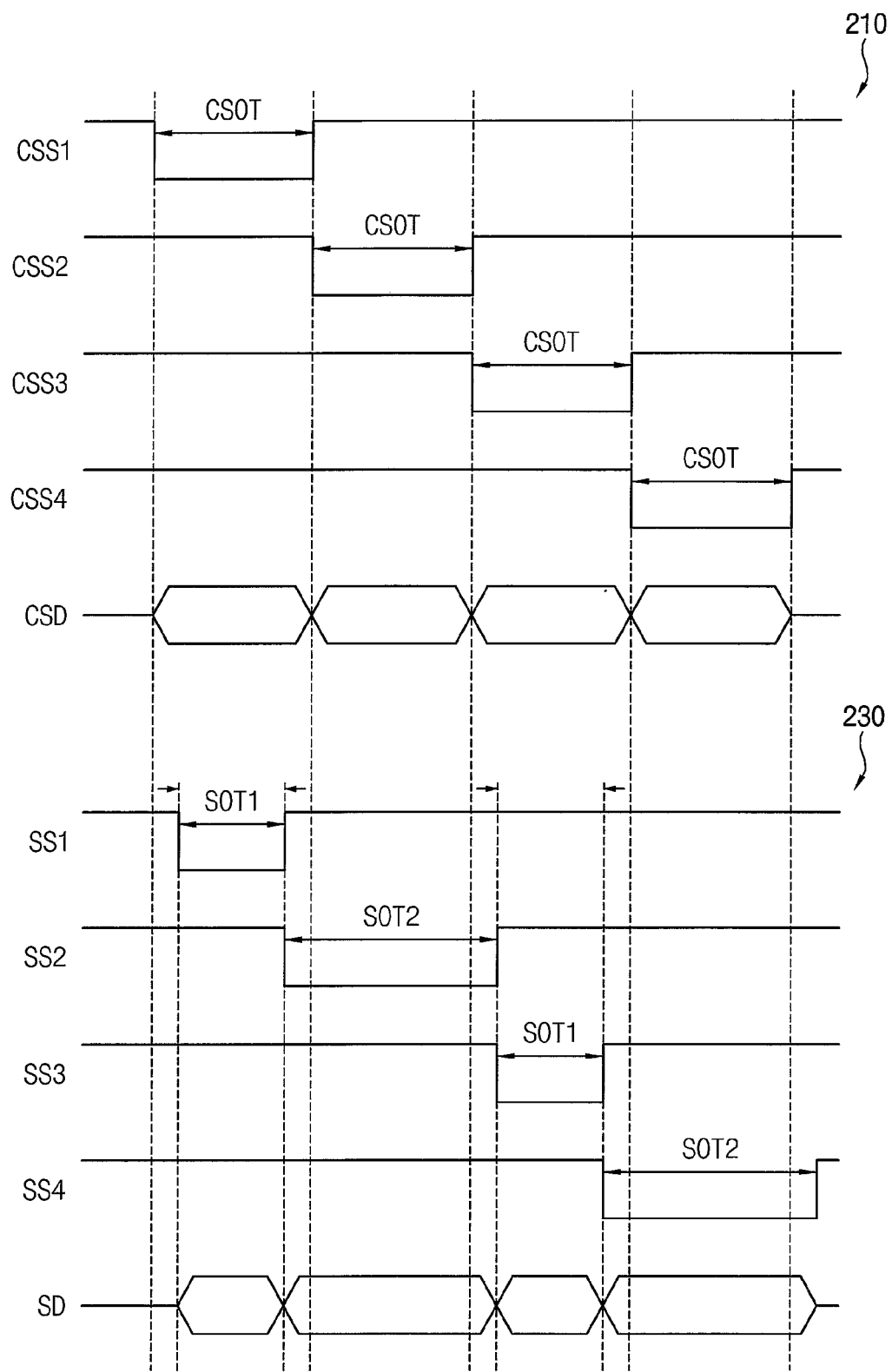
FIG. 4 is a timing diagram illustrating scan signals of a conventional OLED display device and scan signals of an OLED display device according to exemplary embodiments.

FIG. 4 is a timing diagram illustrating scan signals of a conventional OLED display device and scan signals of an OLED display device according to exemplary embodiments.

In FIG. 4, 210 represents conventional scan signals CSS1, CSS2, CSS3 and CSS4 and a conventional data signal CSD, and 230 represents scan signals SS1, SS2, SS3 and SS4 and a data signal SD of an OLED display device according to exemplary embodiments.

The conventional scan signals CSS1, CSS2, CSS3 and CSS4 have the same scan on time CSOT. However, in the OLED display device according to exemplary embodiments, a first scan on time SOT1 of scan signals SS1 and SS3 applied to sub-pixel circuits in odd-numbered rows for driving red and blue OLEDs may be decreased compared with the conventional scan on time CSOT, and a second scan on time SOT2 of scan signals SS2 and SS4 applied to sub-pixel circuits in even-numbered rows for driving green OLEDs may be increased compared with the conventional scan on time CSOT. Further, referring to FIG. 2, during the scan on time SOT1 and SOT2, a first transistor T1 may be turned on to transfer the data signal SD, a third transistor T3 may be turned on to diode-connect a second transistor T2, and thus a threshold voltage compensation operation that a threshold voltage of the second transistor T2 is subtracted from the data signal SD in a storage capacitor CST may be performed. Accordingly, since the second scan on time SOT2 of the scan signals SS2 and SS4 applied to the sub-pixel circuits for driving the green OLEDs is increased, a threshold voltage compensation time for the driving transistors T2 included in the sub-pixel circuits for driving the green OLEDs may be increased, and thus a mura of the OLED display device may be reduced or prevented.

Figure 5:
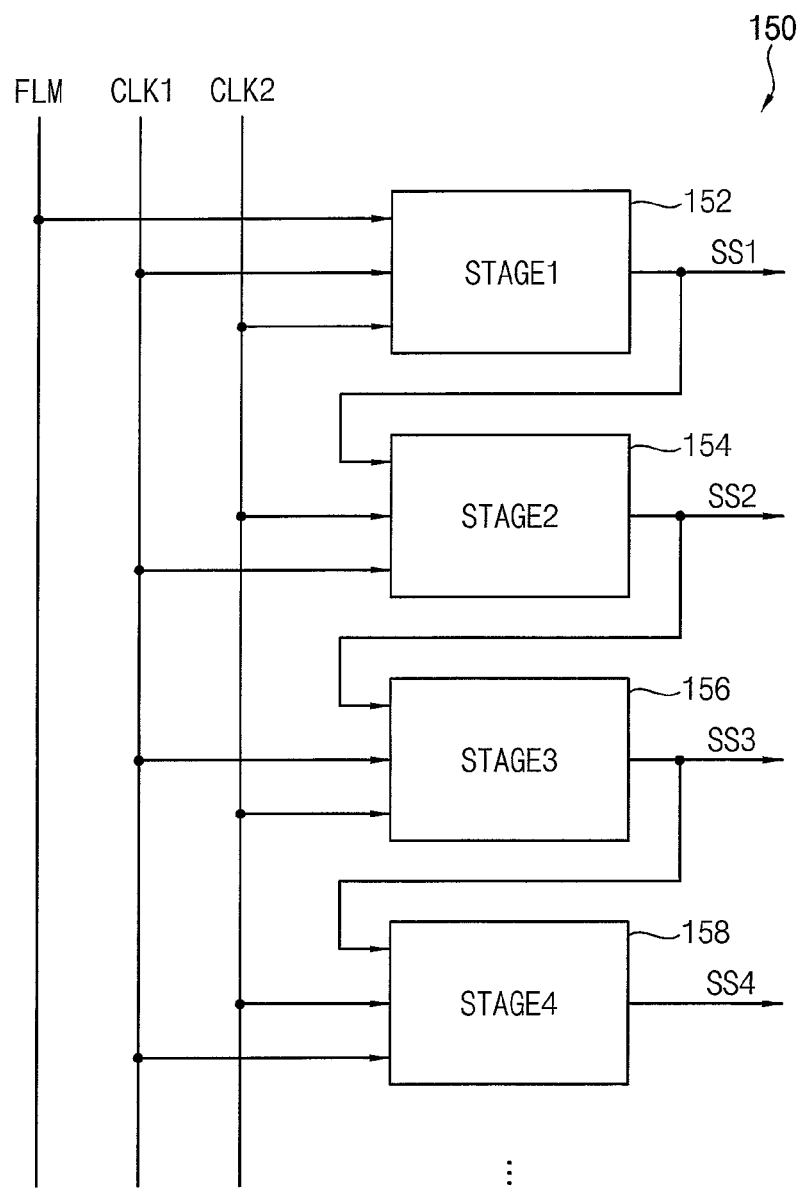
FIG. 5 is a block diagram illustrating an example of a scan driver included in an OLED display device according to exemplary embodiments.
Figure 6:
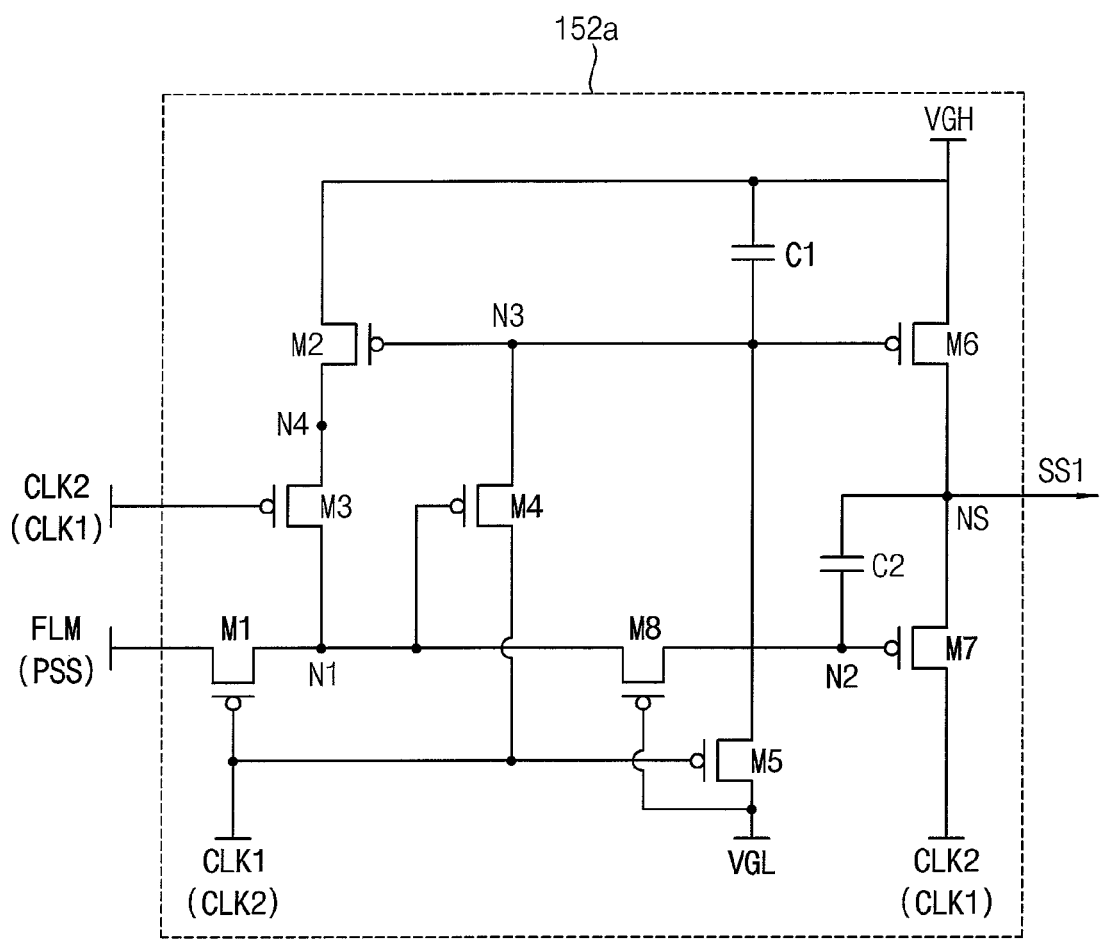
FIG. 6 is a circuit diagram illustrating an example of each stage included in a scan driver of FIG. 5.
Figure 7:
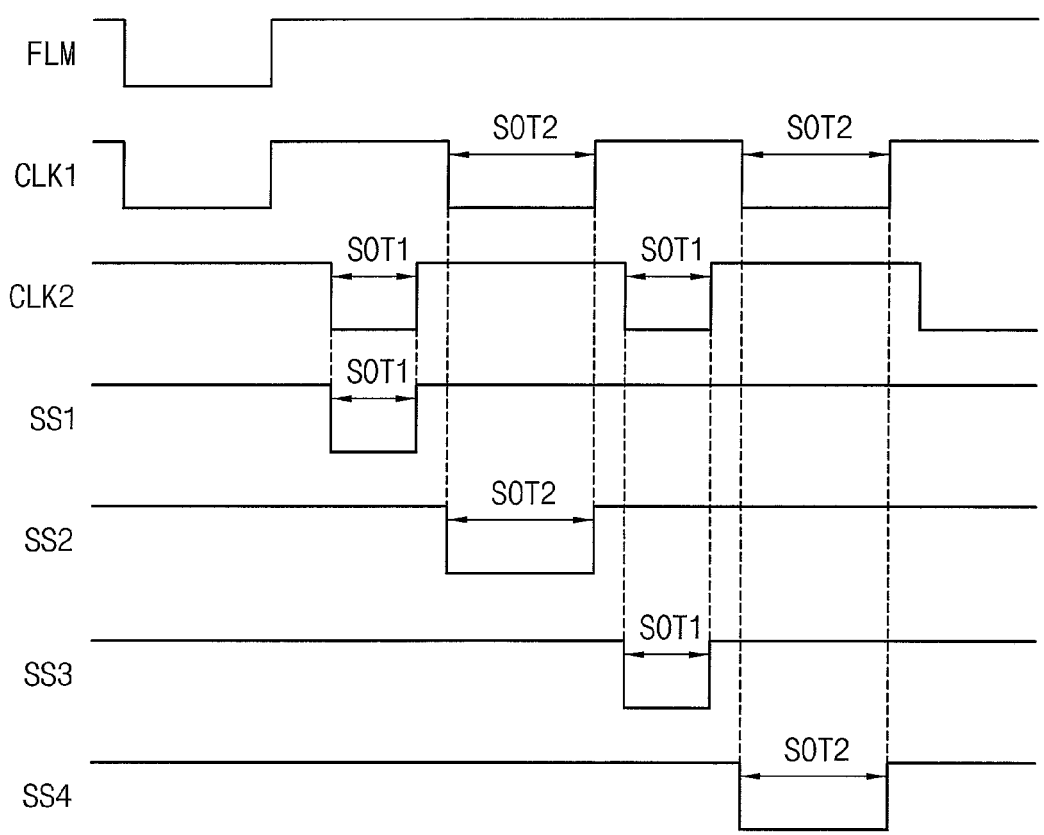
FIG. 7 is a timing diagram for describing an example of an operation of a scan driver of FIG. 5.

FIG. 5 is a block diagram illustrating an example of a scan driver included in an OLED display device according to exemplary embodiments, FIG. 6 is a circuit diagram illustrating an example of each stage included in a scan driver of FIG. 5, and FIG. 7 is a timing diagram for describing an example of an operation of a scan driver of FIG. 5.

Referring to FIG. 5, a scan driver 150 included in an OLED display device according to exemplary embodiments may include a plurality of stages 152, 154, 156 and 158 which outputs a plurality of scan signals SS1, SS2, SS3 and SS4 in response to a start signal FLM (or a previous scan signal), a first clock signal CLK1 and a second clock signal CLK2.

In some exemplary embodiments, as illustrated in FIG. 6, each stage 152a may include a first transistor M1 which transfers the start signal FLM or the previous scan signal PSS to a first node N1 in response to the first clock signal CLK1 (or the second clock signal CLK2 in case of an even-numbered stage 154 and 158), a second transistor M2 which transfers a high gate voltage VGH to a fourth node N4 in response to a voltage of a third node N3, a third transistor M3 which transfers a voltage of the fourth node N4 to the first node N1 in response to the second clock signal CLK2 (or the first clock signal CLK1 in case of an even-numbered stage 154 and 158), a fourth transistor M4 which transfers the first clock signal CLK1 (or the second clock signal CLK2 in case of an even-numbered stage 154 and 158) to the third node N3 in response to a voltage of the first node N1, a fifth transistor M5 which transfers a low gate voltage VGL to the third node N3 in response to the first clock signal CLK1 (or the second clock signal CLK2 in case of an even-numbered stage 154 and 158), a sixth transistor M6 which outputs the high gate voltage VGH as the scan signal SS1 to a scan output node NS in response to the voltage of the third node N3, a seventh transistor M7 which outputs the second clock signal CLK2 (or the first clock signal CLK1 in case of an even-numbered stage 154 and 158) as the scan signal SS1 to the scan output node NS in response to a voltage of a second node N2, an eighth transistor M8 which transfers the voltage of the first node N1 to the second node N2 in response to the low gate voltage VGL, a first capacitor C1 connected between a line of the high gate voltage VGH and the third node N3, and a second capacitor C2 connected between the second node N2 and the scan output node NS. However, the configuration of each stage 152, 154, 156 and 158 of the scan driver 150 according to exemplary embodiments is not limited to the example of FIG. 6.

Referring to FIGS. 5 and 7, the first clock signal CLK1 may have an on period longer than an on period of the second clock signal CLK2. Thus, odd-numbered stages 152 and 156 may output the scan signals SS1 and SS3 having a relatively short scan on time SOT1 during the relatively short on period of the second clock signal CLK2, and even-numbered stages 154 and 158 may output the scan signals SS2 and SS4 having a relatively long scan on time SOT2 during the relatively long on period of the first clock signal CLK1. Accordingly, sub-pixel circuits in even-numbered rows for driving green OLEDs may receive the scan signals SS2 and SS4 having the relatively long scan on time SOT2, a sufficient threshold voltage compensation time for driving transistors included in the sub-pixel circuits for driving the green OLEDs may be obtained, and thus a mura of an OLED display device may be reduced or prevented.

Figure 8:
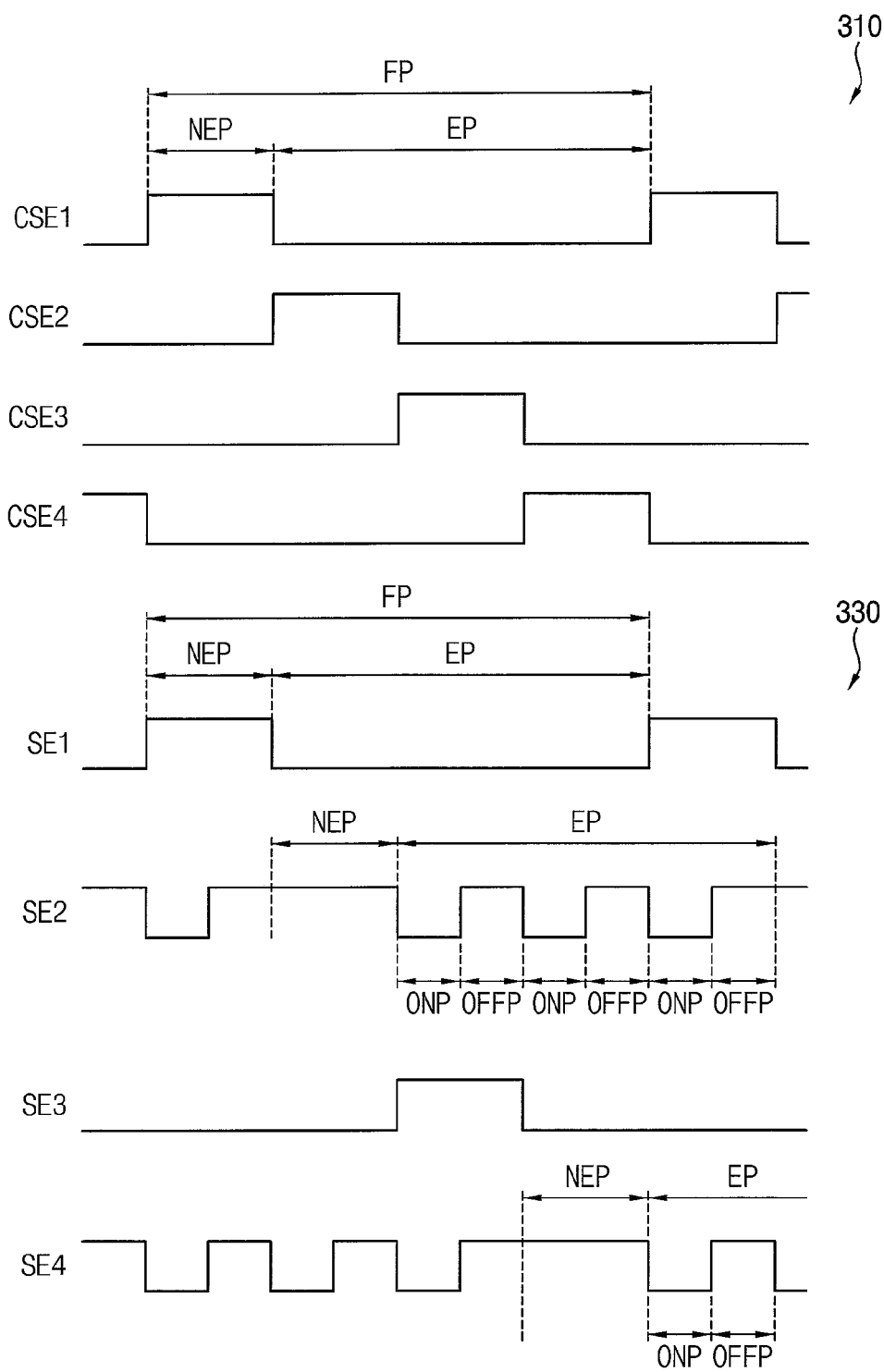
FIG. 8 is a timing diagram illustrating emission control signals of a conventional OLED display device and emission control signals of an OLED display device according to exemplary embodiments.
Figure 9:
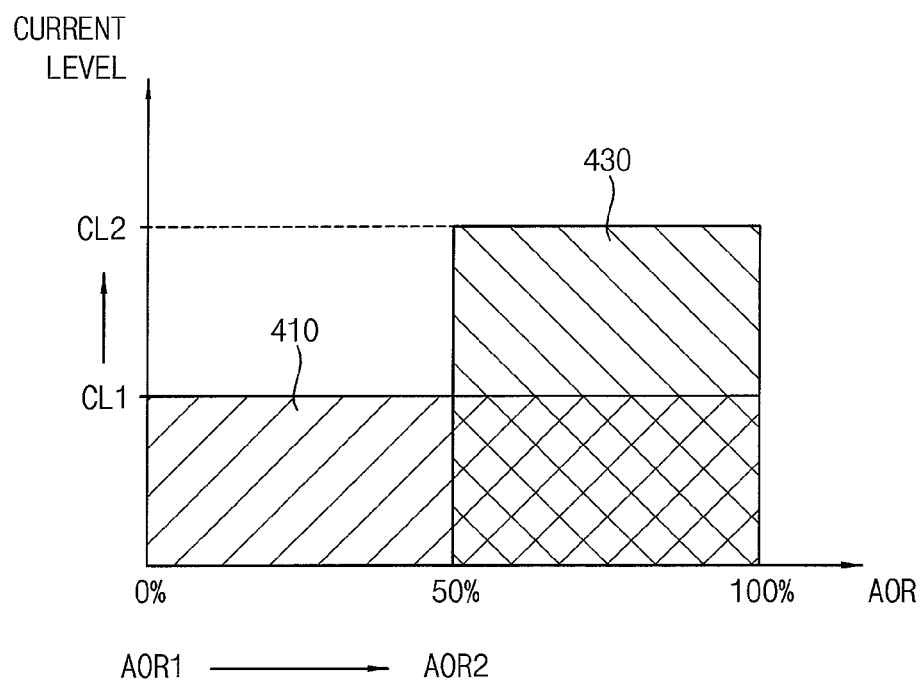
FIG. 9 is a diagram for describing an increase of a driving current level according to an increase of an off period ratio (e.g., an AMOLED off ratio (AOR)) in an OLED display device according to exemplary embodiments.

FIG. 8 is a timing diagram illustrating emission control signals of a conventional OLED display device and emission control signals of an OLED display device according to exemplary embodiments, and FIG. 9 is a diagram for describing an increase of a driving current level according to an increase of an off period ratio (e.g., an AMOLED off ratio (AOR)) in an OLED display device according to exemplary embodiments.

In FIG. 8, 310 represents conventional emission control signals CSE1, CSE2, CSE3 and CSE4, and 330 represents emission control signals SE1, SE2, SE3 and SE4 of an OLED display device according to exemplary embodiments. Each frame period FP may include a non-emission period NEP and an emission period EP. For example, the non-emission period NEP may be a period in which the emission control signals CSE1, CSE2, CSE3, CSE4, SE1, SE2, SE3 and SE4 have an off level (e.g., a high level), and may include a scan period and/or an initialization period. The emission period EP may be a period in which sixth and seventh transistors T6 and T7 are turned on to allow OLEDs to emit light in response to the emission control signals CSE1, CSE2, CSE3, CSE4, SE1, SE2, SE3 and SE4 having an on level (e.g., a low level).

During the emission period EP, the conventional emission control signals CSE1, CSE2, CSE3 and CSE4 may be maintained as the on level. However, in the OLED display device according to exemplary embodiments, at least a portion SE2 and SE4 of the emission control signals SE1, SE2, SE3 and SE4 may have on periods ONP and off periods OFFP within the emission period EP. In some exemplary embodiments, a second off period ratio (e.g., a ratio of a sum of lengths of the off periods OFFP to a length of the emission period EP) of the emission control signals SE2 and SE4 applied to sub-pixel circuits in even-numbered rows for driving green OLEDs may be greater than a first off period ratio of the emission control signals SE1 and SE3 applied to sub-pixel circuits in odd-numbered rows for driving red and blue OLEDs. For example, as illustrated in FIG. 8, the emission control signals SE1 and SE3 applied to the sub-pixel circuits in the odd-numbered rows may be maintained as the on level, or may have the first off period ratio of about 0%, and the emission control signals SE2 and SE4 applied to the sub-pixel circuits in the even-numbered rows may have the off periods OFFP corresponding to a half of the emission period EP, or may have the second off period ratio of about 50%. Thus, the sub-pixel circuits receiving the emission control signals SE1 and SE3 having the first off period ratio of about 0% may drive the red and blue OLEDs with the first off period ratio of about 0%, but the sub-pixel circuits receiving the emission control signals SE2 and SE4 having the second off period ratio of about 50% may drive the green OLEDs with the second off period ratio of about 50%. That is, the green OLEDs may be driven with an increased off period ratio.

Further, as illustrated in FIG. 9, the sub-pixel circuits in the even-numbered rows may provide the green OLEDs with a driving current that is increased corresponding to the increased off period ratio. For example, if the second off period ratio AOR2 is increased to about 50% compared with the first off period ratio AOR1 of about 0%, the driving current provided to the green OLEDs may be increased from a first driving current level CL1 to a second driving current level CL2 such that an area 430 defined by the second off period ratio AOR2 and the second driving current level CL2 becomes substantially the same as an area 410 defined by the first off period ratio AOR1 and the first driving current level CL1. Accordingly, driving transistors included in the sub-pixels for driving the green OLEDs may generate the increased driving current, or a higher driving current, thereby reducing an afterimage caused by a hysteresis of the driving transistors.

Figure 10:
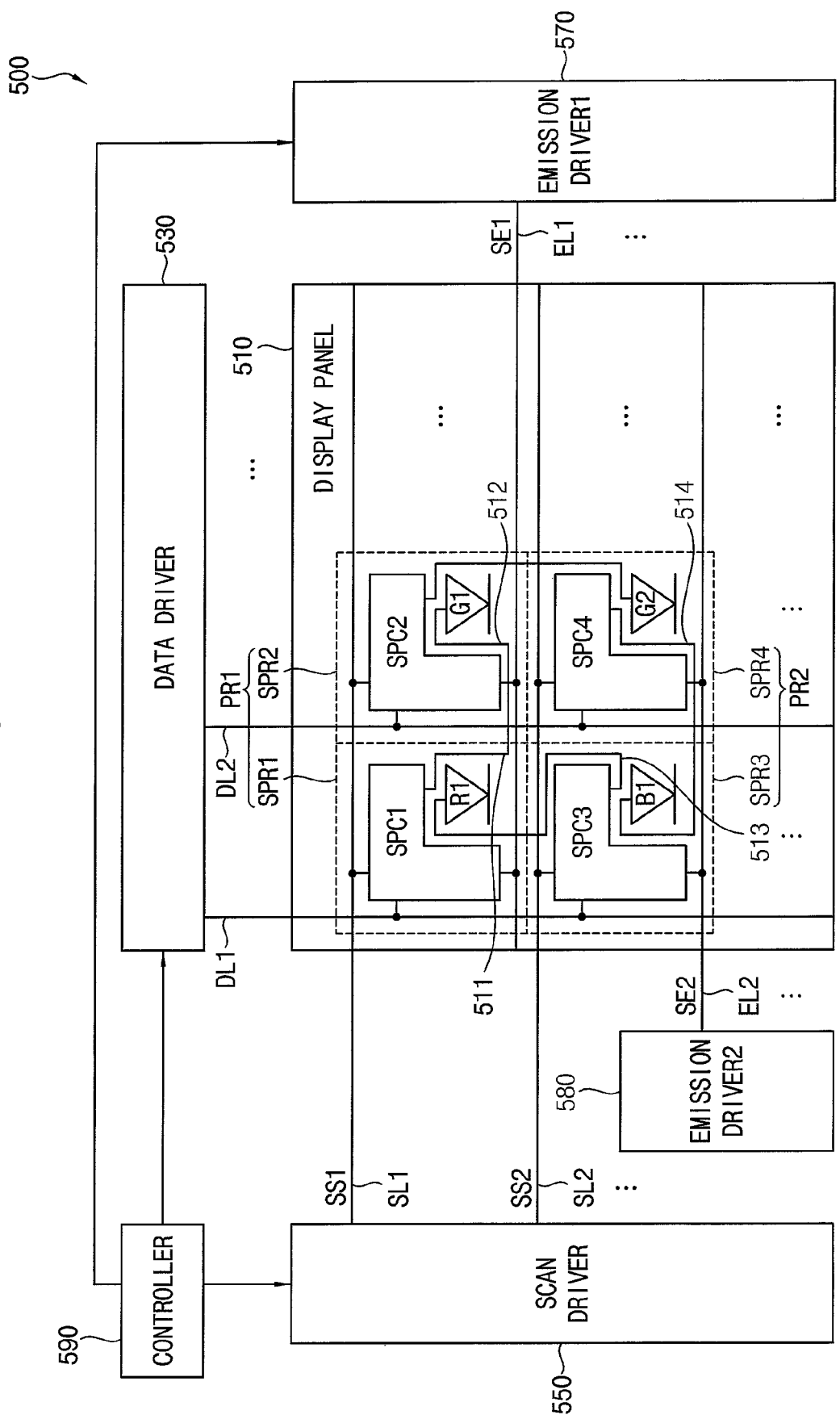
FIG. 10 is a block diagram illustrating an OLED display device according to exemplary embodiments.

FIG. 10 is a block diagram illustrating an OLED display device according to exemplary embodiments.

Referring to FIG. 10, an OLED display device 500 may include a display panel 510, a data driver 530 which provides data signals to the display panel 510, a scan driver 550 which provides scan signals SS1 and SS2 to the display panel 510, an emission driver 570 and 580 which provides emission control signals SE1 and SE2 to the display panel 510, and a controller 590 which controls the data driver 530, the scan driver 550 and the emission driver 570 and 580. The OLED display device 500 of FIG. 10 may have a similar configuration and a similar operation to an OLED display device 100 of FIG. 1, except that, in four sub-pixel regions SPR1, SPR2, SPR3 and SPR4 in two adjacent rows and two adjacent columns, respective sub-pixel circuits SCP1, SCP2, SCP3 and SCP4 may drive OLEDs G1, G2, R1 and B1 that are adjacent to the sub-pixel circuits SCP1, SCP2, SCP3 and SCP4 in a clockwise direction.

The display panel 510 may include a first OLED R1 emitting light of a first color (e.g., a red color) in a first sub-pixel region SPR1, a second OLED G1 emitting light of a second color (e.g., a green color) in a second sub-pixel region SPR2 adjacent to the first sub-pixel region SPR1 in a row direction, a third OLED B1 emitting light of a third color (e.g., a blue color) in a third sub-pixel region SPR3 adjacent to the first sub-pixel region SPR1 in a column direction, and a fourth OLED G2 emitting light of the second color in a fourth sub-pixel region SPR4 adjacent to the second sub-pixel region SPR2 in the column direction and adjacent to the third sub-pixel region SPR3 in the row direction.

The display panel 510 may further include first through fourth sub-pixel circuits SPC1, SPC2, SPC3 and SPC4 in the first through fourth sub-pixel regions SPR1, SPR2, SPR3 and SPR4, respectively. The display panel 510 may further include a first line 511 for connecting the first sub-pixel circuit SPC1 in the first sub-pixel region SPR1 to the second OLED G1 in the second sub-pixel region SPR2, a second line 512 for connecting the second sub-pixel circuit SPC2 in the second sub-pixel region SPR2 to the fourth OLED G4 in the fourth sub-pixel region SPR4, a third line 513 for connecting the third sub-pixel circuit zs SPC3 in the third sub-pixel region SPR3 to the first OLED R1 in the first sub-pixel region SPR1, and a fourth line 514 for connecting the fourth sub-pixel circuit SPC4 in the fourth sub-pixel region SPR4 to the third OLED B1 in the third sub-pixel region SPR3.

In the display panel 510, the first, second, third and fourth sub-pixel circuits SCP1, SCP2, SCP3 and SCP4 may drive the second, fourth, first and third OLEDs G1, G2, R1 and B1 that are adjacent to the first, second, third and fourth sub-pixel circuits SCP1, SCP2, SCP3 and SCP4 in the clockwise direction. Thus, the first sub-pixel circuit SPC1 in the first sub-pixel region SPR1 may drive the second OLED G1 in the second sub-pixel region SPR2, the second sub-pixel circuit SPC2 in the second sub-pixel region SPR2 may drive the fourth OLED G2 in the fourth sub-pixel region SPR4, the fourth sub-pixel circuit SPC4 in the fourth sub-pixel region SPR4 may drive the third OLED B1 in the third sub-pixel region SPR3, and the third sub-pixel circuit SPC3 in the third sub-pixel region SPR3 may drive the first OLED R1 in the first sub-pixel region SPR1.

Accordingly, in some exemplary embodiments, the sub-pixel circuits SPC1 and SPC2 in a first row (e.g., an odd-numbered row), or the sub-pixel circuits SPC1 and SPC2 connected to a first scan line (e.g., an odd-numbered scan line) SL1 and/or a first emission control line (e.g., an odd-numbered emission control line) EL1 may drive only the OLEDs G1 and G2 emitting the light of the second color (e.g., the green color), and the sub-pixel circuits SPC3 and SPC4 in a second row (e.g., an even-numbered row), or the sub-pixel circuits SPC3 and SPC4 connected to a second scan line (e.g., an even-numbered scan line) SL2 and/or a second emission control line (e.g., an even-numbered emission control line) EL2 may drive only the OLEDs R1 and B1 emitting the light of the first color (e.g., the red color) or the third color (e.g., the blue color). Thus, since the sub-pixel circuits SPC1 and SPC2 for driving the OLEDs G1 and G2 emitting the light of the second color (e.g., the green color) are connected to the scan and emission control lines SL1 and EL1 separate from the scan and emission control lines SL2 and EL2 connected to the sub-pixel circuits SPC3 and SPC4 for driving the OLEDs R1 and B1 emitting the light of the first color (e.g., the red color) or the third color (e.g., the blue color), the OLEDs G1 and G2 emitting the light of the second color may be driven under a driving condition (e.g., a scan on time, an off period ratio (which may be referred to as an AMOLED off ratio (AOR)), etc.) different from a driving condition for the OLEDs R1 and B1 emitting the light of the first color or the third color.

In some exemplary embodiments, the scan driver 550 may apply a first scan signal SS1 having a first scan on time (SOT) to the first scan line (e.g., the odd-numbered scan line) SL1 connected to the sub-pixel circuits SPC1 and SPC2 for driving the OLEDs G1 and G2 emitting the light of the second color, and may apply a second scan signal SS2 having a second SOT different (in length) from the first SOT to the second scan line (e.g., the even-numbered scan line) SL2 connected to the sub-pixel circuits SPC3 and SPC4 for driving the OLEDs R1 and B1 emitting the light of the first color or the third color. For example, the first SOT of the first scan signal SS1 applied to the sub-pixel circuits SPC1 and SPC2 for driving the OLEDs G1 and G2 emitting the light of the second color may be longer than the second SOT of the second scan signal SS2 applied to the sub-pixel circuits SPC3 and SPC4 for driving the OLEDs R1 and B1 emitting the light of the first color or the third color. Accordingly, a first threshold voltage compensation time for driving transistors included in the sub-pixel circuits SPC1 and SPC2 for driving the OLEDs G1 and G2 emitting the light of the second color may be longer than a second threshold voltage compensation time for driving transistors included in the sub-pixel circuits SPC3 and SPC4 for driving the OLEDs R1 and B1 emitting the light of the first color or the third color. Thus, the sub-pixel circuit SPC1 and SPC2 for driving the green OLED G1 and G2 that is vulnerable to a mura may perform a threshold voltage compensation operation for a sufficient threshold voltage compensation time. Accordingly, the mura of the OLED display device 500 may be reduced or prevented.

Further, in some exemplary embodiments, the OLED display device 500 may include a first emission driver 570 located at a first side (e.g., a right side) of the display panel 510, and a second emission driver 580 located at a second side (e.g., a left side) opposite to the first side of the display panel 510. The first emission driver 570 may apply a first emission control signal SE1 with a first off period ratio to a first emission control line (e.g., odd-numbered emission control line) EL1 such that the first emission control signal SE1 having the first off period ratio may be provided to the sub-pixel circuits SPC1 and SPC2 for driving the OLEDs G1 and G2 emitting the light of the second color. The second emission driver 580 may apply a second emission control signal SE2 with a second off period ratio to a second emission control line (e.g., an even-numbered emission control line) EL2 such that the second emission control signal SE2 having the second off period ratio may be provided to the sub-pixel circuits SPC3 and SPC4 for driving the OLEDs R1 and B1 emitting the light of the first color or the third color. In some exemplary embodiments, the first off period ratio of the first emission control signal SE1 applied to the sub-pixel circuits SPC1 and SPC2 for driving the OLEDs G1 and G2 emitting the light of the second color may be greater than the second off period ratio of the second emission control signal SE2 applied to the sub-pixel circuits SPC3 and SPC4 for driving the OLEDs R1 and B1 emitting the light of the first color or the third color. Further, the sub-pixel circuits SPC1 and SPC2 receiving the first emission control signal SE1 may provide the OLEDs G1 and G2 emitting the light of the second color with a driving current that is increased corresponding to the increased first off period ratio. Accordingly, the OLED display device 500 according to exemplary embodiments may allow the driving transistors of the sub-pixel circuits SPC1 and SPC2 to generate the increased driving currents, or higher driving currents, thereby reducing an afterimage caused by a hysteresis of the driving transistors.

As described above, in the OLED display device 500 according to exemplary embodiments, the OLEDs R1, G1, B1 and G2 may be arranged in an RGBG pentile structure, and the four sub-pixel circuits SPC1, SPC2, SPC3 and SPC4 in two rows and two columns may drive the four OLEDs G1, G2, R1 and B1 that are adjacent to the sub-pixel circuits SPC1, SPC2, SPC3 and SPC4 in the clockwise direction. Thus, the sub-pixel circuits SPC1 and SPC2 for driving the OLEDs G1 and G2 of the second color (e.g., the green color) and the sub-pixel circuits SPC3 and SPC4 for driving the OLEDs R1 and B1 of the first and third colors (e.g., the red and blue colors) may be disposed in different rows. Accordingly, the OLEDs G1 and G2 of the second color can be driven under a driving condition (e.g., the SOT, the AOR, etc.) different from a driving condition for the OLEDs R1 and B1 of the first and third colors, and thus the mura and/or the afterimage may be reduced.

Figure 11:
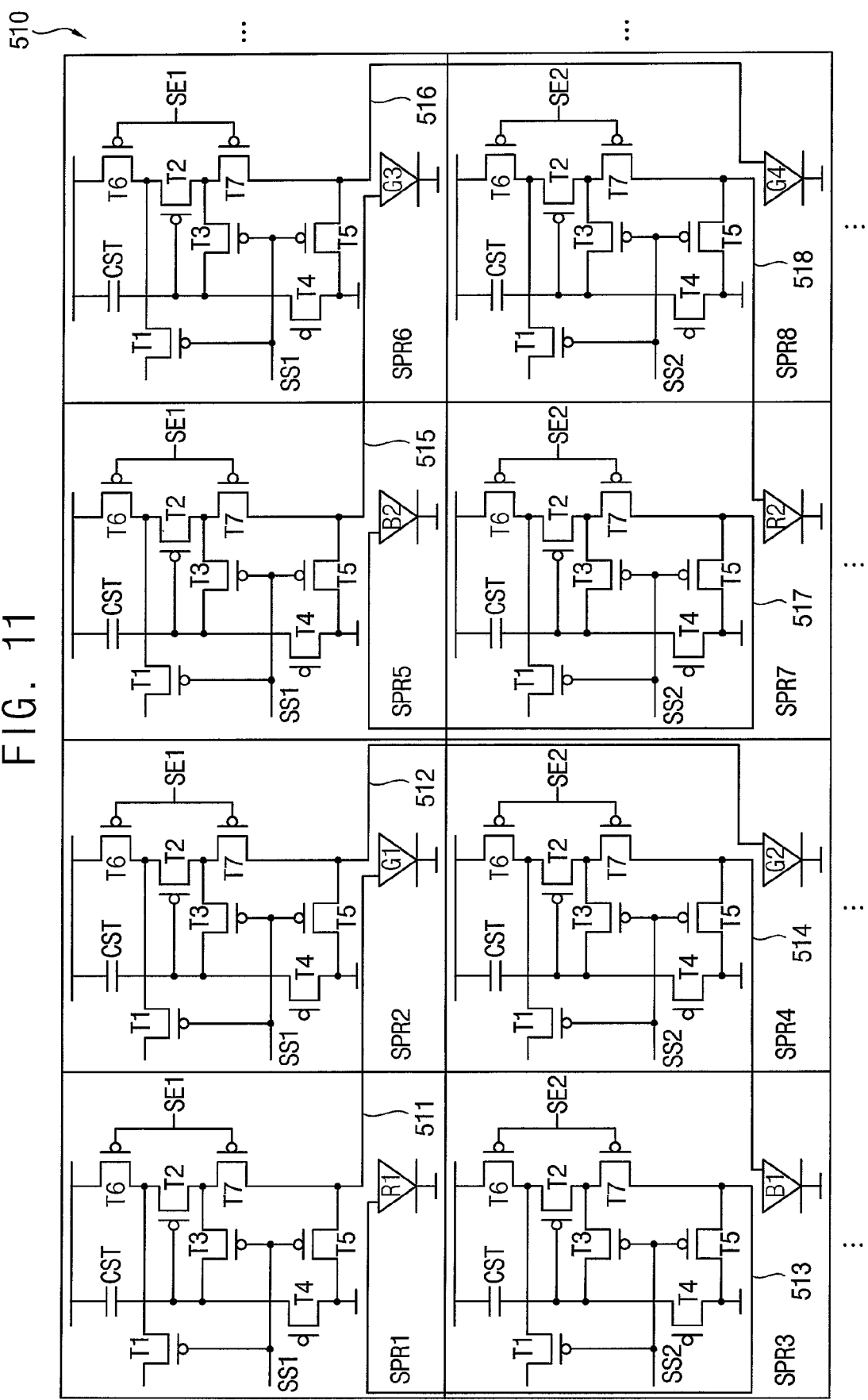
FIG. 11 is a circuit diagram illustrating an example of a display panel according to exemplary embodiments.

FIG. 11 is a circuit diagram illustrating an example of a display panel according to exemplary embodiments.

Referring to FIG. 11, a display panel 510 may include a plurality of sub-pixel regions SPR1, SPR2, SPR3, SPR4, SPR5, SPR6, SPR7 and SPR8, and, in each sub-pixel region SPR1, SPR2, SPR3, SPR4, SPR5, SPR6, SPR7 and SPR8, one of the OLEDs R1, G1, B1, G2, B2, G3, R2 and G4 and one sub-pixel circuit may be disposed. The display panel 510 of FIG. 11 may have a similar configuration and a similar operation to a display panel 110 of FIG. 2, except that, in four sub-pixel regions (e.g., SPR1, SPR2, SPR3 and SPR4) in two adjacent rows and two adjacent columns, respective sub-pixel circuits may drive OLEDs (e.g., G1, G2, R1 and B1) that are adjacent to the sub-pixel circuits in a clockwise direction.

In an example of FIG. 11, a first sub-pixel circuit in a first sub-pixel region SPR1 may be connected to a second OLED G1 in a second sub-pixel region SPR2 through a first line 511, a second sub-pixel circuit in the second sub-pixel region SPR2 may be connected to a fourth OLED G2 in a fourth sub-pixel region SPR4 through a second line 512, and the first and second sub-pixel circuits may drive the second and fourth OLEDs G1 and G2 emitting green light. A third sub-pixel circuit in a third sub-pixel region SPR3 to a first OLED R1 in the first sub-pixel region SPR1 through a third line 513, a fourth sub-pixel circuit in the fourth sub-pixel region SPR4 may be connected to a third OLED B1 in the third sub-pixel region SPR3 through a fourth line 514, and the third and fourth sub-pixel circuits may drive the first and third OLEDs R1 and B1 emitting red light and blue light.

Further, a fifth sub-pixel circuit in a fifth sub-pixel region SPR5 may be connected to a sixth OLED G3 in a sixth sub-pixel region SPR6 through a fifth line 515, a sixth sub-pixel circuit in the sixth sub-pixel region SPR6 may be connected to an eighth OLED G4 in an eighth sub-pixel region SPR8 through a sixth line 516, and the fifth and eighth sub-pixel circuits may drive the eighth and eighth OLEDs G3 and G4 emitting the green light. A seventh sub-pixel circuit in a seventh sub-pixel region SPR7 to a fifth OLED B2 in the fifth sub-pixel region SPR5 through a seventh line 517, an eighth sub-pixel circuit in the eighth sub-pixel region SPR8 may be connected to a seventh OLED R2 in the seventh sub-pixel region SPR7 through an eighth line 518, and the seventh and eighth sub-pixel circuits may drive the fifth and seventh OLEDs B2 and R2 emitting the blue light and the red light.

Accordingly, the sub-pixel circuits driving the green OLEDs G1, G2, G3 and G4 may receive a first scan signal SS1 and a first emission control signal SE1, and the sub-pixel circuits driving the red and blue OLEDs R1, B1, B2 and R2 may receive a second scan signal SS2 different from the first scan signal SS1 and a second emission control signal SE2 different from the first emission control signal SE1. Since the sub-pixel circuits driving the green OLEDs G1, G2, G3 and G4 receive the first scan signal SS1 and the first emission control signal SE1 different from the second scan signal SS2 and the second emission control signal SE2 applied to the sub-pixel circuits driving the red and blue OLEDs R1, B1, B2 and R2, the green OLEDs G1, G2, G3 and G4 and the red and blue OLEDs R1, B1, B2 and R2 may be driven under different driving conditions (e.g., different SOTs, different off period ratios, etc.).

Figure 12:
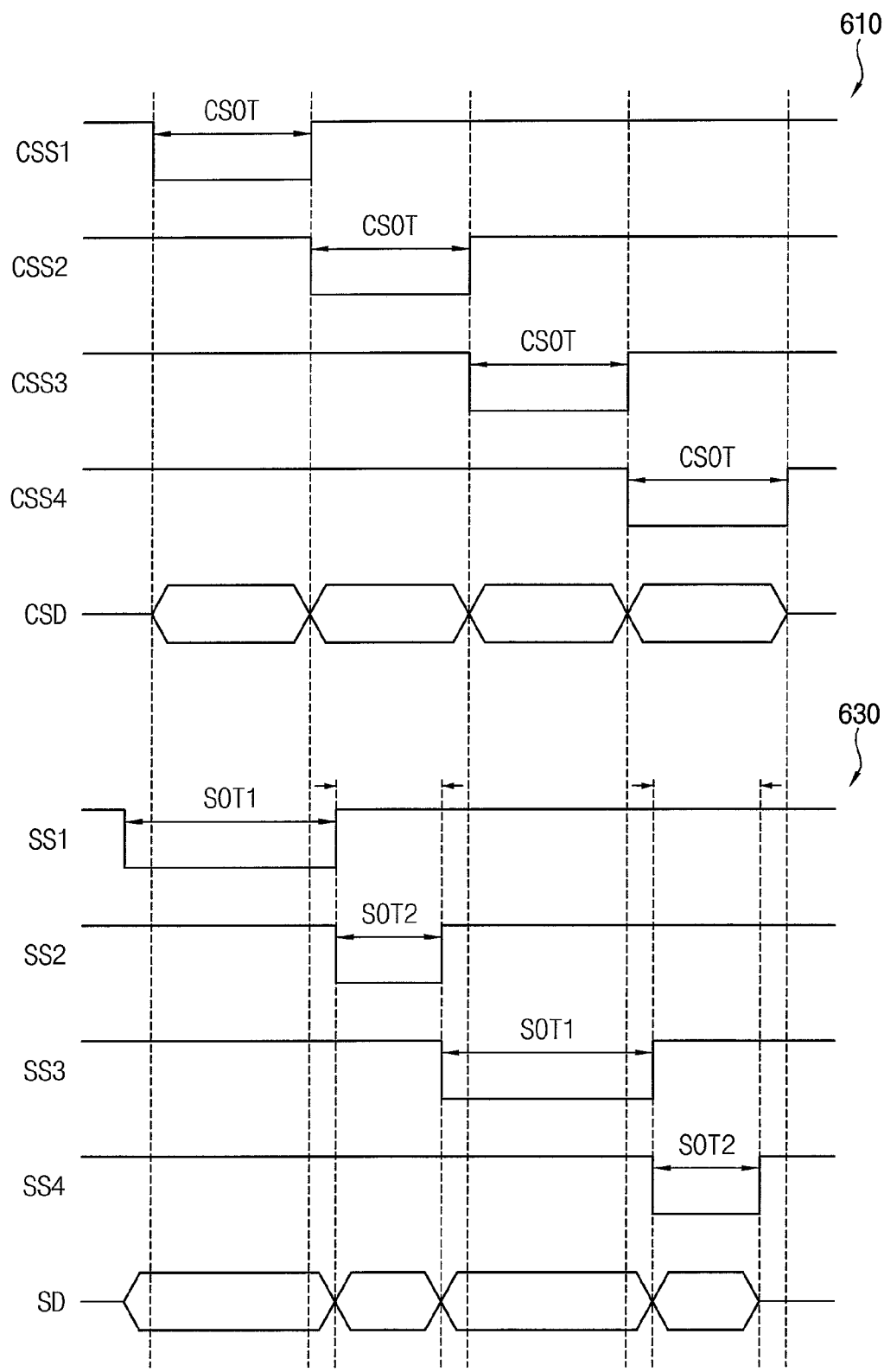
FIG. 12 is a timing diagram illustrating scan signals of a conventional OLED display device and scan signals of an OLED display device according to exemplary embodiments.

FIG. 12 is a timing diagram illustrating scan signals of a conventional OLED display device and scan signals of an OLED display device according to exemplary embodiments.

In FIG. 12, 610 represents conventional scan signals CSS1, CSS2, CSS3 and CSS4 and a conventional data signal CSD, and 630 represents scan signals SS1, SS2, SS3 and SS4 and a data signal SD of an OLED display device according to exemplary embodiments.

The conventional scan signals CSS1, CSS2, CSS3 and CSS4 have the same scan on time CSOT. However, in the OLED display device according to exemplary embodiments, a second scan on time SOT2 of scan signals SS2 and SS4 applied to sub-pixel circuits in even-numbered rows for driving red and blue OLEDs may be decreased compared with the conventional scan on time CSOT, and a first scan on time SOT1 of scan signals SS1 and SS3 applied to sub-pixel circuits in odd-numbered rows for driving green OLEDs may be increased compared with the conventional scan on time CSOT. Accordingly, since the first scan on time SOT1 of the scan signals SS1 and SS3 applied to the sub-pixel circuits driving the green OLEDs is increased, a threshold voltage compensation time for the driving transistors T2 included in the sub-pixel circuits driving the green OLEDs may be increased, and thus a mura of the OLED display device may be reduced or prevented.

Figure 13:
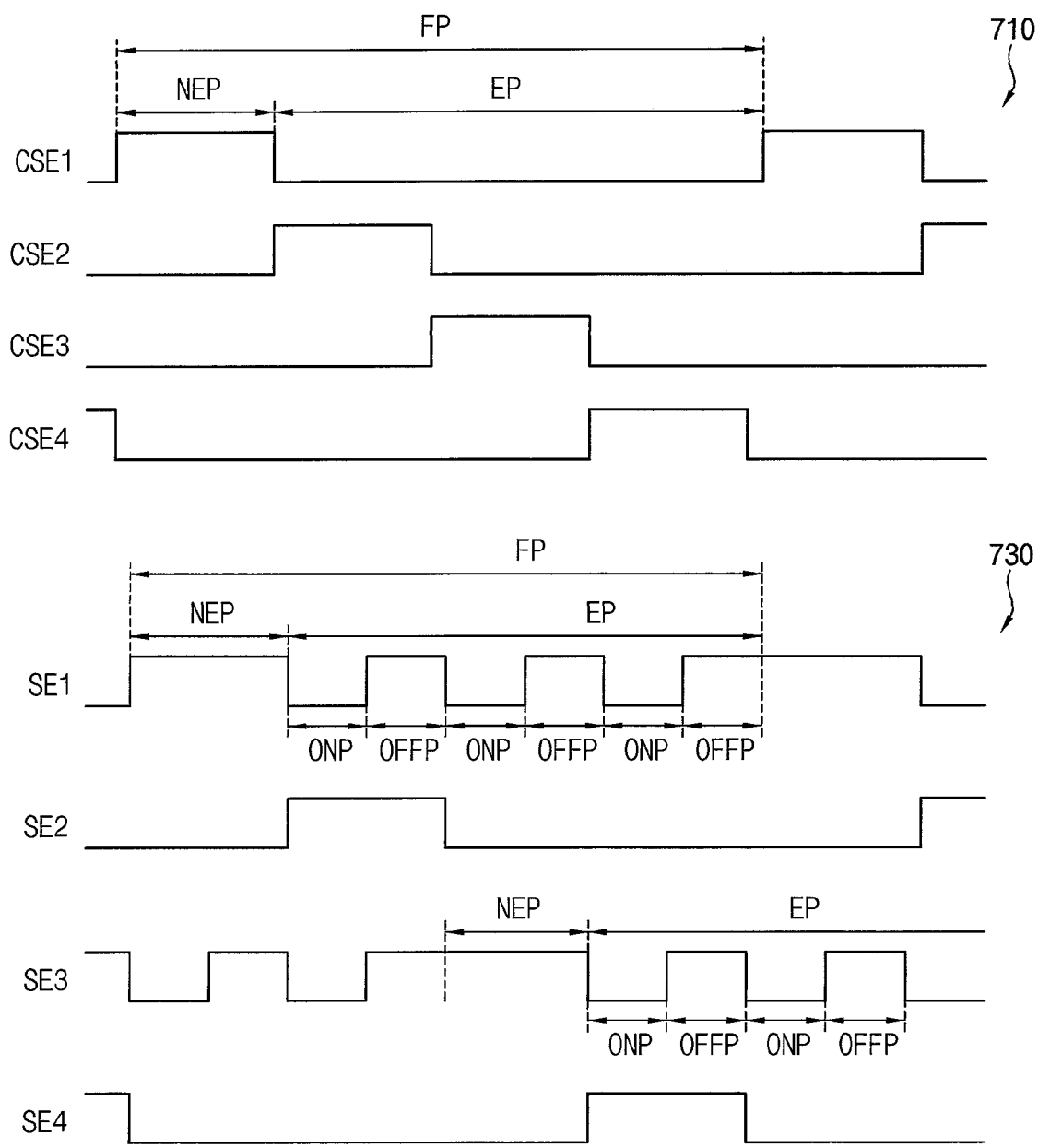
FIG. 13 is a timing diagram illustrating emission control signals of a conventional OLED display device and emission control signals of an OLED display device according to exemplary embodiments.

FIG. 13 is a timing diagram illustrating emission control signals of a conventional OLED display device and emission control signals of an OLED display device according to exemplary embodiments.

In FIG. 13, 710 represents conventional emission control signals CSE1, CSE2, CSE3 and CSE4, and 730 represents emission control signals SE1, SE2, SE3 and SE4 of an OLED display device according to exemplary embodiments.

During an emission period EP, the conventional emission control signals CSE1, CSE2, CSE3 and CSE4 may be maintained as the on level. However, in the OLED display device according to exemplary embodiments, at least a portion SE1 and SE3 of the emission control signals SE1, SE2, SE3 and SE4 may have on periods ONP and off periods OFFP within the emission period EP. In some exemplary embodiments, a first off period ratio (e.g., a ratio of a sum of lengths of the off periods OFFP to a length of the emission period EP) of the emission control signals SE1 and SE3 applied to sub-pixel circuits in odd-numbered rows for driving green OLEDs may be greater than a second off period ratio of the emission control signals SE2 and SE4 applied to sub-pixel circuits in even-numbered rows for driving red and blue OLEDs. Further, the sub-pixel circuits in the odd-numbered rows may provide the green OLEDs with a driving current that is increased corresponding to the increased off period ratio. Accordingly, driving transistors included in the sub-pixels for driving the green OLEDs may generate the increased driving current, or a higher driving current, thereby reducing an afterimage caused by a hysteresis of the driving transistors.

Figure 14:
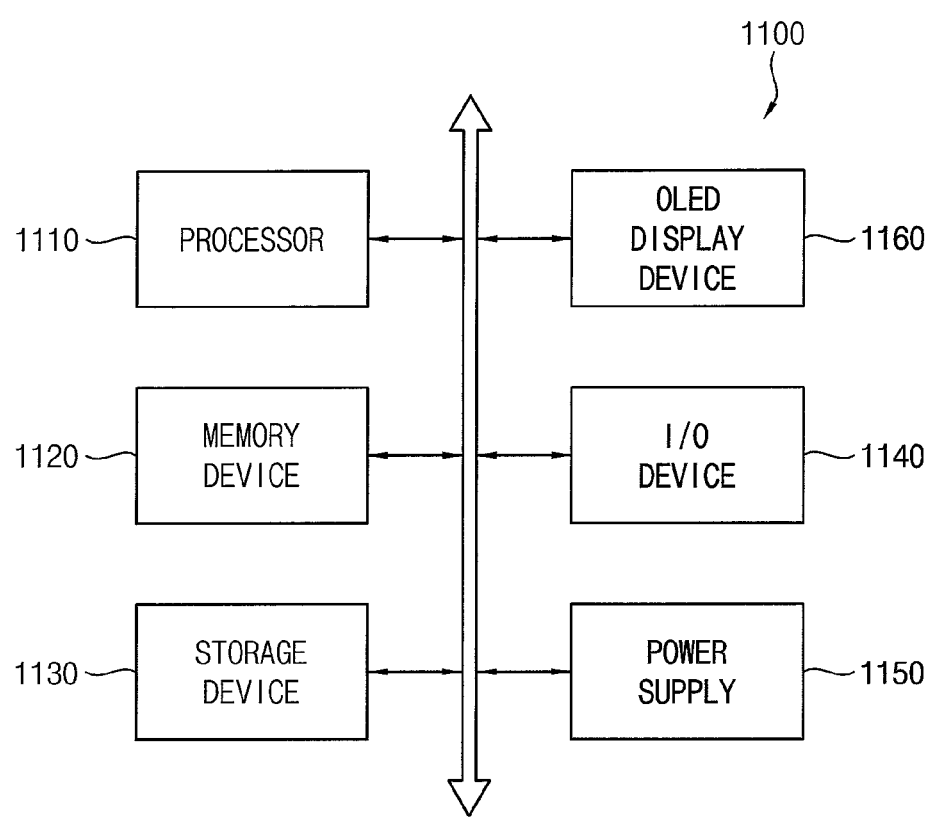
FIG. 14 is a block diagram illustrating an example of an electronic device including an OLED display device according to exemplary embodiments.

FIG. 14 is a block diagram illustrating an example of an electronic device including an OLED display device according to exemplary embodiments.

Referring to FIG. 14, an electronic device 1100 may include a processor 1110, a memory device 1120, a storage device 1130, an input/output (I/O) device 1140, a power supply 1150, and an OLED display device 1160. The electronic device 1100 may further include a plurality of ports for communicating a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be coupled to other components via an address bus, a control bus, a data bus, etc. Further, in some exemplary embodiments, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc, and an output device such as a printer, a speaker, etc. The power supply 1150 may supply power for operations of the electronic device 1100.

In the OLED display device 1160, OLEDs may be arranged in an RGBG pentile structure, and four sub-pixel circuits in two rows and two columns may drive the OLEDs that are adjacent to the sub-pixel circuits in a counterclockwise direction or a clockwise direction. Thus, the sub-pixel circuits for driving the OLEDs of a second color (e.g., a green color) and the sub-pixel circuits for driving the OLEDs of first and third colors (e.g., red and blue colors) may be disposed in different rows. Accordingly, the OLEDs of the second color can be driven under a driving condition (e.g., an SOT, an AOR, etc.) different from a driving condition for the OLEDs of the first and third colors, and thus a mura and/or an afterimage may be reduced.

According to exemplary embodiments, the electronic device 1100 may be any electronic device including the OLED display device 1160, such as a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel of an organic light emitting diode (OLED) display device, the display panel comprising:
    a first OLED disposed in a first sub-pixel region located in a first row, and configured to emit light of a first color;
    a second OLED disposed in a second sub-pixel region located in the first row, and configured to emit light of a second color;
    a third OLED disposed in a third sub-pixel region located in a second row, and configured to emit light of a third color;
    a fourth OLED disposed in a fourth sub-pixel region located in the second row, and configured to emit light of the second color;
    a first sub-pixel circuit disposed in the first sub-pixel region, and configured to drive the third OLED in the third sub-pixel region;
    a second sub-pixel circuit disposed in the second sub-pixel region, and configured to drive the first OLED in the first sub-pixel region;
    a third sub-pixel circuit disposed in the third sub-pixel region, and configured to drive the fourth OLED in the fourth sub-pixel region; and
    a fourth sub-pixel circuit disposed in the fourth sub-pixel region, and configured to drive the second OLED in the second sub-pixel region.

2. The display panel of claim 1, wherein the first OLED is a red OLED configured to emit red light,
    wherein the second and fourth OLEDs are green OLEDs configured to emit green light, and wherein the third OLED is a blue OLED configured to emit blue light.

3. The display panel of claim 1, further comprising:
a first line configured to connect the first sub-pixel circuit in the first sub-pixel region to the third OLED in the third sub-pixel region;
a second line configured to connect the second sub-pixel circuit in the second sub-pixel region to the first OLED in the first sub-pixel region;
a third line configured to connect the third sub-pixel circuit in the third sub-pixel region to the fourth OLED in the fourth sub-pixel region; and
a fourth line configured to connect the fourth sub-pixel circuit in the fourth sub-pixel region to the second OLED in the second sub-pixel region.

4. The display panel of claim 1, wherein the first and second sub-pixel circuits in the first and second sub-pixel regions are configured to receive a same first scan signal through a first scan line, and
wherein the third and fourth sub-pixel circuits in the third and fourth sub-pixel regions are configured to receive a same second scan signal through a second scan line.

5. The display panel of claim 1, wherein the first and second sub-pixel circuits in the first and second sub-pixel regions are configured to receive a same first emission control signal through a first emission control line, and
wherein the third and fourth sub-pixel circuits in the third and fourth sub-pixel regions are configured to receive a same second emission control signal through a second emission control line.

6. A display panel of an organic light emitting diode (OLED) display device, comprising:
a first OLED disposed in a first sub-pixel region located in a first row, and configured to emit light of a first color;
a second OLED disposed in a second sub-pixel region located in the first row, and configured to emit light of a second color;
a third OLED disposed in a third sub-pixel region located in a second row, and configured to emit light of a third color;
a fourth OLED disposed in a fourth sub-pixel region located in the second row, and configured to emit light of the second color;
a first sub-pixel circuit disposed in the first sub-pixel region, and configured to drive the second OLED in the second sub-pixel region;
a second sub-pixel circuit disposed in the second sub-pixel region, and configured to drive the fourth OLED in the fourth sub-pixel region;
a third sub-pixel circuit disposed in the third sub-pixel region, and configured to drive the first OLED in the first sub-pixel region; and
a fourth sub-pixel circuit disposed in the fourth sub-pixel region, and configured to drive the third OLED in the third sub-pixel region.

7. The display panel of claim 6, wherein the first OLED is a red OLED configured to emit red light,
wherein the second and fourth OLEDs are green OLEDs configured to emit green light, and
wherein the third OLED is a blue OLED configured to emit blue light.

8. The display panel of claim 6, further comprising:
a first line configured to connect the first sub-pixel circuit in the first sub-pixel region to the second OLED in the second sub-pixel region;
a second line configured to connect the second sub-pixel circuit in the second sub-pixel region to the fourth OLED in the fourth sub-pixel region;
a third line configured to connect the third sub-pixel circuit in the third sub-pixel region to the first OLED in the first sub-pixel region; and
a fourth line configured to connect the fourth sub-pixel circuit in the fourth sub-pixel region to the third OLED in the third sub-pixel region.

9. The display panel of claim 6, wherein the first and second sub-pixel circuits in the first and second sub-pixel regions are configured to receive a same first scan signal through a first scan line,
wherein the third and fourth sub-pixel circuits in the third and fourth sub-pixel regions are configured to receive a same second scan signal through a second scan line, and
wherein a first SOT of the first scan signal applied to the first and second sub-pixel circuits is longer than a second SOT of the second scan signal applied to the third and fourth sub-pixel circuits.

10. The display panel of claim 6, wherein the first and second sub-pixel circuits in the first and second sub-pixel regions are configured to receive a same first emission control signal through a first emission control line,
wherein the third and fourth sub-pixel circuits in the third and fourth sub-pixel regions are configured to receive a same second emission control signal through a second emission control line, and
wherein a first off period ratio of the first emission control signal applied to the first and second sub-pixel circuits is greater than a second off period ratio of the second emission control signal applied to the third and fourth sub-pixel circuits.

11. The display panel of claim 10, wherein the first and second sub-pixel circuits are configured to drive the second and fourth OLEDs to emit the light of the second color with the first off period ratio that is increased compared with the second off period ratio for the first and third OLEDs, and
wherein the first and second sub-pixel circuits are configured to provide the second and fourth OLEDs with a driving current corresponding to the increased first off period ratio, the driving current being provided to the second and fourth OLEDs being greater than a driving current provided to the first and third OLEDs.

12. An organic light emitting diode (OLED) display device, comprising:
a display panel;
a data driver configured to provide data signals to the display panel;
a scan driver configured to provide scan signals to the display panel;
an emission driver configured to provide emission control signals to the display panel; and
a controller configured to control the data driver, the scan driver and the emission driver,
wherein the display panel comprises:
a first OLED disposed in a first sub-pixel region located in a first row, and configured to emit light of a first color;
a second OLED disposed in a second sub-pixel region located in the first row, and configured to emit light of a second color;
a third OLED disposed in a third sub-pixel region located in a second row, and configured to emit light of a third color;

a fourth OLED disposed in a fourth sub-pixel region located in the second row, and configured to emit light of the second color;

a first sub-pixel circuit disposed in the first sub-pixel region, and configured to drive the third OLED in the third sub-pixel region;

a second sub-pixel circuit disposed in the second sub-pixel region, and configured to drive the first OLED in the first sub-pixel region;

a third sub-pixel circuit disposed in the third sub-pixel region, and configured to drive the fourth OLED in the fourth sub-pixel region; and a fourth sub-pixel circuit disposed in the fourth sub-pixel region, and configured to drive the second OLED in the second sub-pixel region, wherein the first and second sub-pixel circuits in the first and second sub-pixel regions are configured to receive a same first scan signal through a first scan line, and wherein the third and fourth sub-pixel circuits in the third and fourth sub-pixel regions are configured to receive a same second scan signal through a second scan line.

13. The display device of claim 12, wherein the scan driver is configured to provide the first scan signal and the second scan signal, and a second scan on time (SOT) of the second scan signal applied to the third and fourth sub-pixel circuits is different from a first SOT of the first scan signal applied to the first and second sub-pixel circuits.

14. The display device of claim 13, wherein a second SOT of the second scan signal applied to the third and fourth sub-pixel circuits is longer than a first SOT of the first scan signal applied to the first and second sub-pixel circuits.

15. The display device of claim 14, wherein a second threshold voltage compensation time for driving transistors included in the third and fourth sub-pixel circuits is longer than a first threshold voltage compensation time for driving transistors included in the first and second sub-pixel circuits.

16. The display device of claim 12, wherein the emission driver is configured to provide a first emission control signal and a second emission control signal, and the first and second sub-pixel circuits in the first and second sub-pixel regions are configured to receive the first emission control signal through a first emission control line, and wherein the third and fourth sub-pixel circuits in the third and fourth sub-pixel regions are configured to receive the second emission control signal through a second emission control line.

17. The display device of claim 16, wherein a second off period ratio of the second emission control signal applied to the third and fourth sub-pixel circuits is different from a first off period ratio of the first emission control signal applied to the first and second sub-pixel circuits.

18. The display device of claim 16, wherein a second off period ratio of the second emission control signal applied to the third and fourth sub-pixel circuits is greater than a first off period ratio of the first emission control signal applied to the first and second sub-pixel circuits.

19. The display device of claim 18, wherein the third and fourth sub-pixel circuits drive the second and fourth OLEDs to emit the light of the second color with the second off period ratio that is increased compared with the first off period ratio for the first and third OLEDs.

20. The display device of claim 19, wherein the third and fourth sub-pixel circuits provide the second and fourth OLEDs with a driving current corresponding to the increased second off period ratio, the driving current being provided to the second and fourth OLEDs being greater than a driving current provided to the first and third OLEDs.

21. The display device of claim 16, wherein the first and second sub-pixel circuits are configured to receive the first emission control signal from a first emission driver located at a first side of the display panel, and wherein the third and fourth sub-pixel circuits are configured to receive the second emission control signal from a second emission driver located at a second side opposite to the first side of the display panel.

\* \* \* \* \*